(12) United States Patent
Huang et al.

(10) Patent No.: US 12,266,657 B2
(45) Date of Patent: Apr. 1, 2025

(54) HYBRID CELL-BASED DEVICE, LAYOUT, AND METHOD

(71) Applicant: TAIWAN SEMICONDUCTOR MANUFACTURING COMPANY, LTD., Hsinchu (TW)

(72) Inventors: Yu-Xuan Huang, Hsinchu (TW); Shih-Wei Peng, Hsinchu (TW); Te-Hsin Chiu, Hsinchu (TW); Hou-Yu Chen, Hsinchu (TW); Kuan-Lun Cheng, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 211 days.

(21) Appl. No.: 17/452,338

(22) Filed: Oct. 26, 2021

(65) Prior Publication Data

US 2022/0367460 A1  Nov. 17, 2022

Related U.S. Application Data

(60) Provisional application No. 63/188,329, filed on May 13, 2021.

(51) Int. Cl.
| | | |
|---|---|---|
| *H01L 27/092* | (2006.01) | |
| *H01L 21/8238* | (2006.01) | |
| *H01L 23/528* | (2006.01) | |
| *H01L 27/02* | (2006.01) | |

(52) U.S. Cl.
CPC .. *H01L 27/0922* (2013.01); *H01L 21/823892* (2013.01); *H01L 23/5286* (2013.01); *H01L 27/0207* (2013.01); *H01L 27/092* (2013.01); *H01L 27/0928* (2013.01); *H01L 21/823871* (2013.01)

(58) Field of Classification Search
CPC ..... H01L 21/823871; H01L 21/823892; H01L 27/0207; H01L 27/0922; H01L 27/092; H01L 27/0928; H01L 23/5286
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 9,935,012 B1* | 4/2018 | Gao | ................. H01L 29/66795 |
| 2013/0328162 A1* | 12/2013 | Hu | ...................... H01L 27/0635 |
| | | | 257/E29.174 |
| 2014/0040838 A1 | 2/2014 | Liu et al. | |

(Continued)

FOREIGN PATENT DOCUMENTS

| | | |
|---|---|---|
| TW | 201816979 | 5/2018 |
| TW | 201944576 | 11/2019 |

(Continued)

*Primary Examiner* — Michael M Trinh
(74) *Attorney, Agent, or Firm* — Hauptman Ham, LLP

(57) ABSTRACT

An integrated circuit (IC) device includes a first plurality of active areas extending in a first direction and having a first pitch in a second direction perpendicular to the first direction, and a second plurality of active areas extending in the first direction, offset from the first plurality of active areas in the first direction, and having a second pitch in the second direction. A ratio of the second pitch to the first pitch is 3:2.

20 Claims, 14 Drawing Sheets

(56) References Cited

U.S. PATENT DOCUMENTS

| | | | |
|---|---|---|---|
| 2015/0278429 A1 | 10/2015 | Chang | |
| 2017/0255735 A1* | 9/2017 | Kim | H01L 27/0924 |
| 2019/0348527 A1* | 11/2019 | Liaw | H01L 21/823821 |
| 2020/0135724 A1* | 4/2020 | Lin | H01L 23/5286 |
| 2020/0402968 A1* | 12/2020 | Zhuang | H01L 27/0207 |

FOREIGN PATENT DOCUMENTS

| | | |
|---|---|---|
| TW | 201945828 | 12/2019 |
| TW | 202018787 | 5/2020 |

* cited by examiner

HYBRID CELL-BASED DEVICE, LAYOUT, AND METHOD

PRIORITY CLAIM

The present application claims the priority of U.S. Provisional Application No. 63/188,329, filed May 13, 2021, which is incorporated herein by reference in its entirety.

BACKGROUND

An integrated circuit (IC) typically includes a number of semiconductor devices otherwise known as IC devices. One way to represent an IC device is with a plan view diagram referred to as a layout diagram, or IC layout diagram. An IC layout diagram is hierarchical and includes modules which carry out high-level functions in accordance with the IC device design specifications. The modules are often built from a combination of cells that can include both standard and custom cells, each of which represents one or more semiconductor structures manufactured based on the IC layout diagram.

Cells are configured to provide common, low-level functions, often performed by transistors based on gate regions that intersect active regions, sometimes known as oxide definition (OD) regions. The elements of a cell are arranged within a cell boundary and electrically connected to other cells through interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
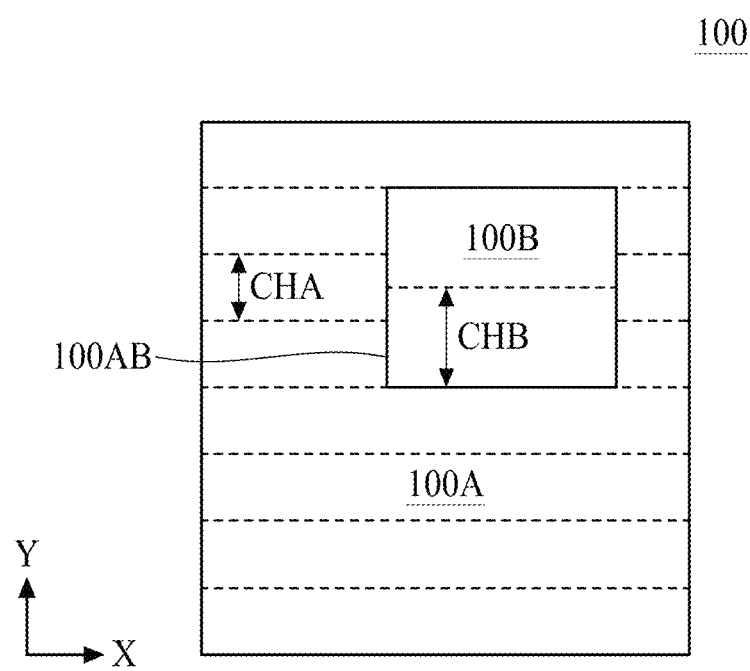
FIGS. 1A and 1B are diagrams of an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC device based on an IC layout diagram includes a first region in which rows of cells have a first pitch based on a first cell height and a second region in which rows of cells align with cell rows of the first region and have a second pitch based on a second cell height, thereby being taller and having greater speed and power than the cells in the first region. Circuit designs that include relatively taller cells in critical paths and relatively shorter cells in non-critical paths are thereby capable of achieving high speeds more efficiently than designs that do not include relatively taller and shorter cells.

In the various embodiments, a ratio of the second pitch to the first pitch is 3:2. Compared to approaches that do not include adjacent regions having a 3:2 pitch ratio, the various embodiments are capable of including groups of relatively taller cells stacked in multiple rows separate from groups of relatively shorter cells stacked in multiple rows such that circuit efficiency is further improved.

Figure 1B:
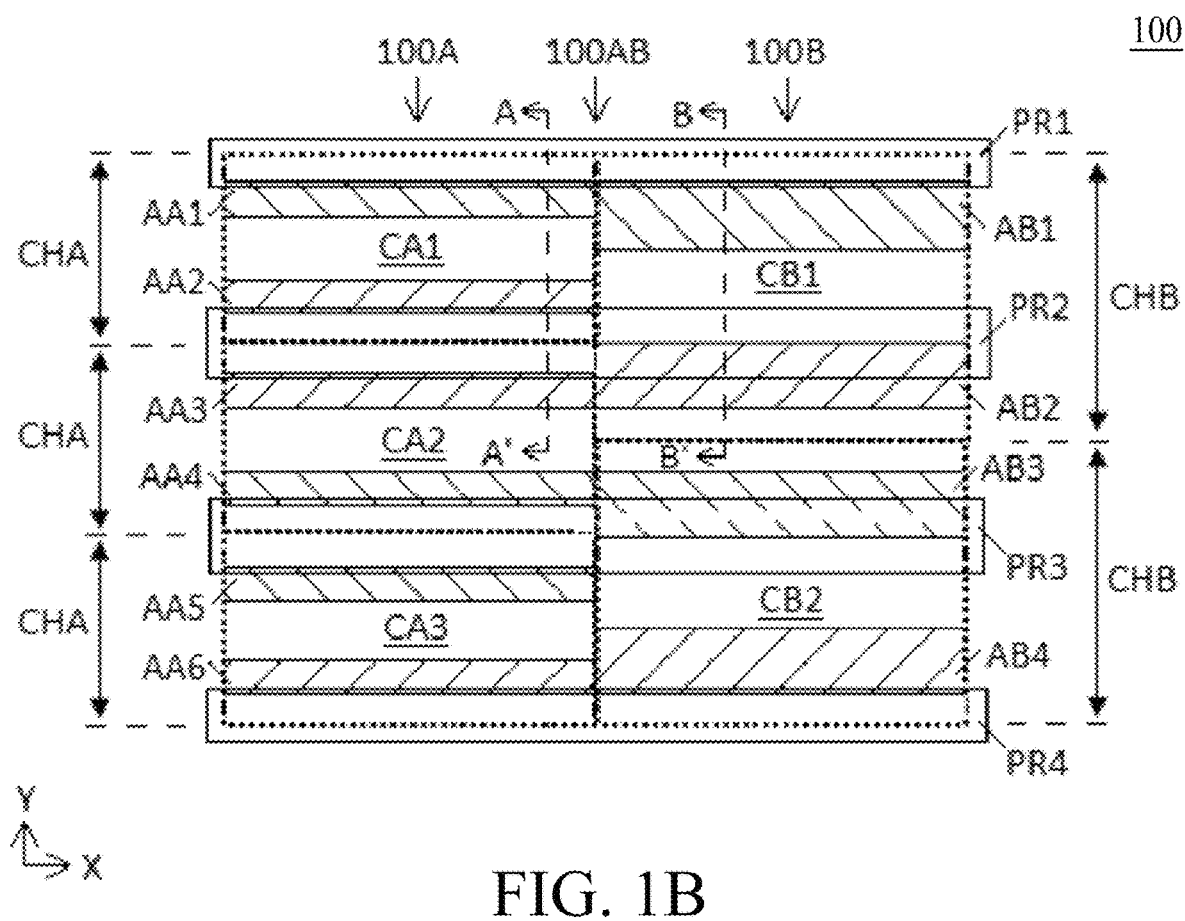
Figure 2A:
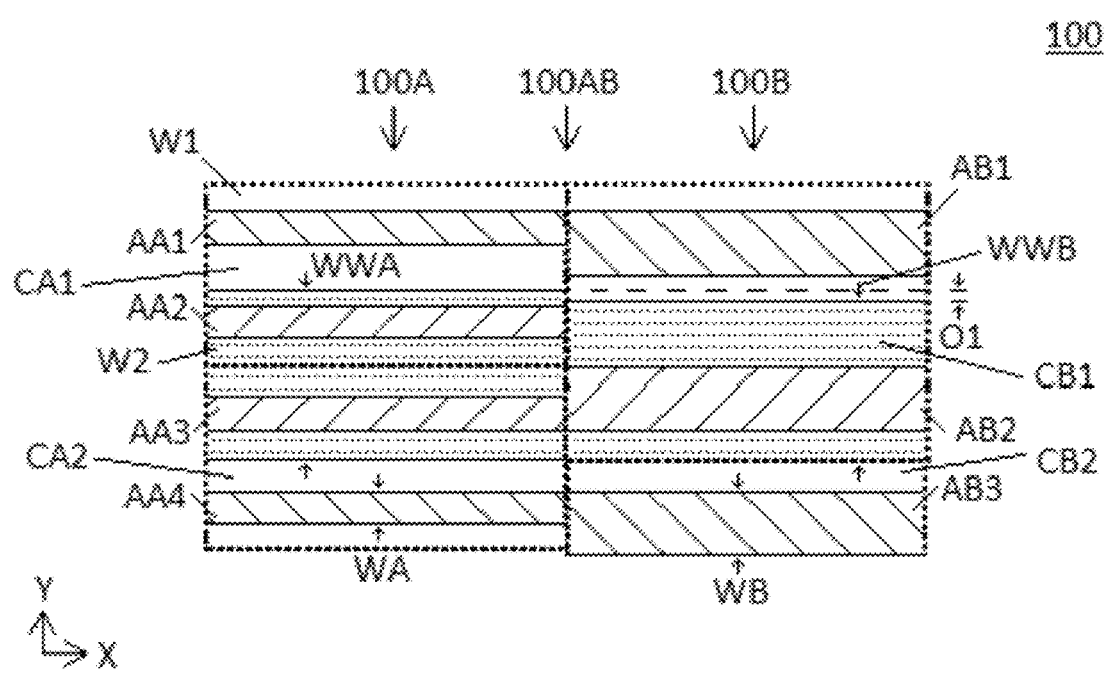
FIGS. 2A-2C are diagrams of an IC device, in accordance with some embodiments.
Figure 2B:
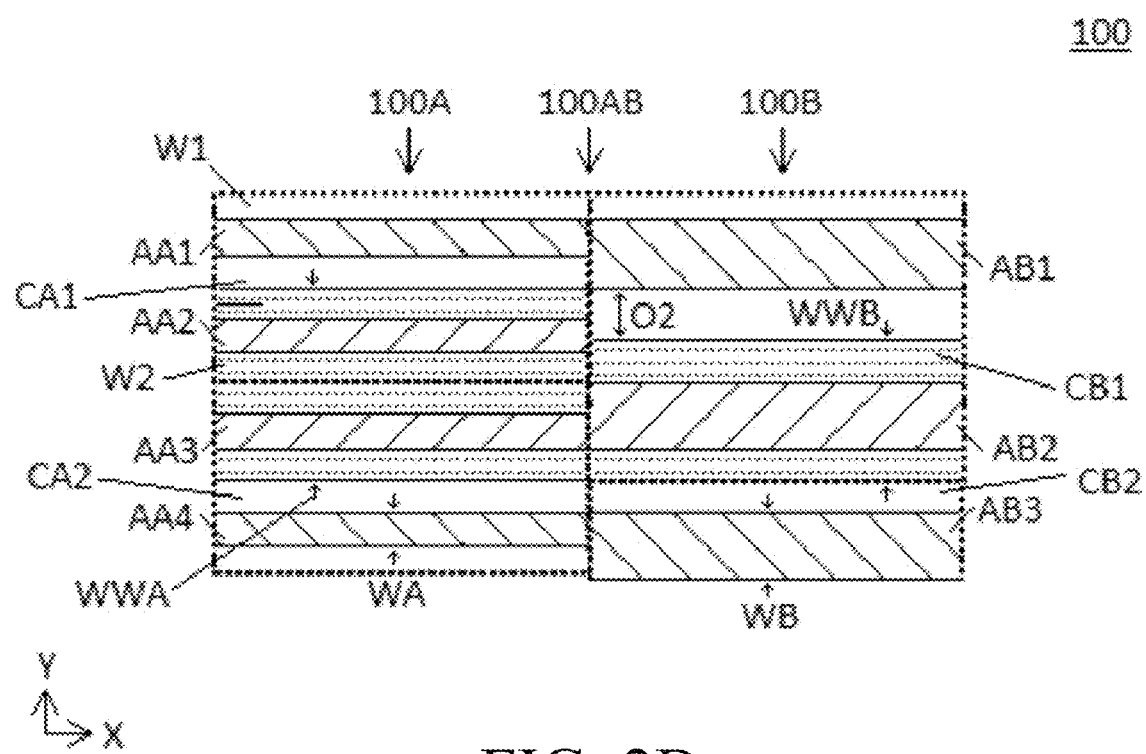
Figure 2C:
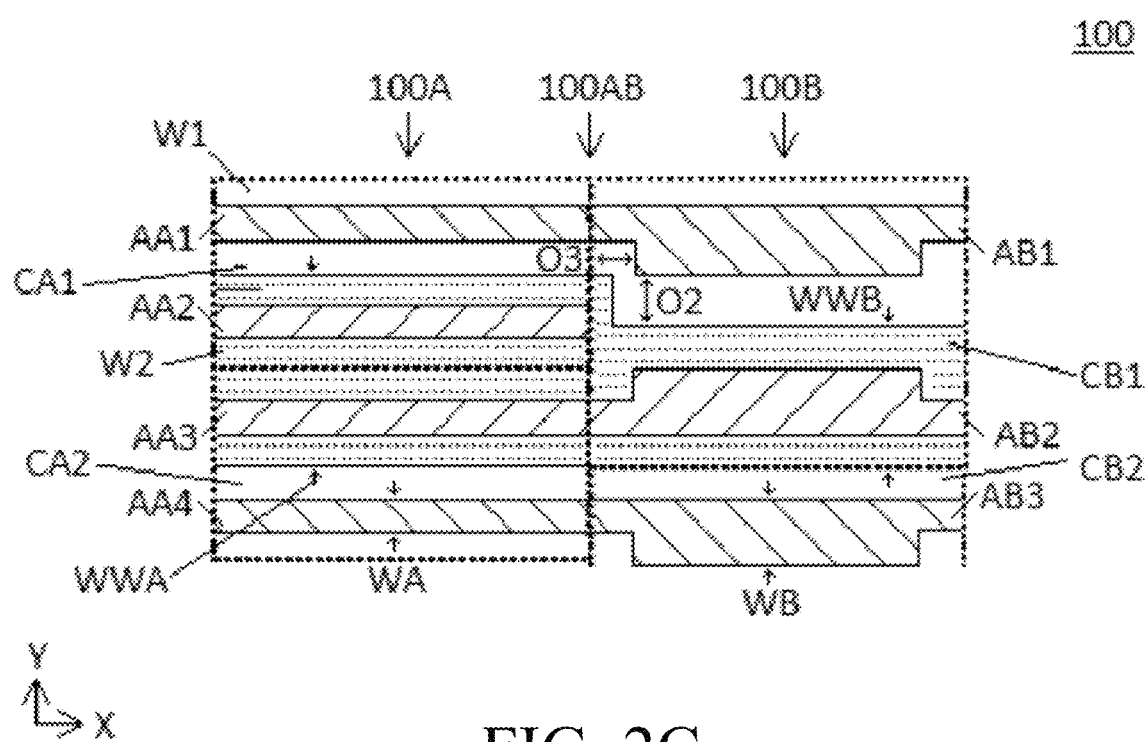
Figure 3:
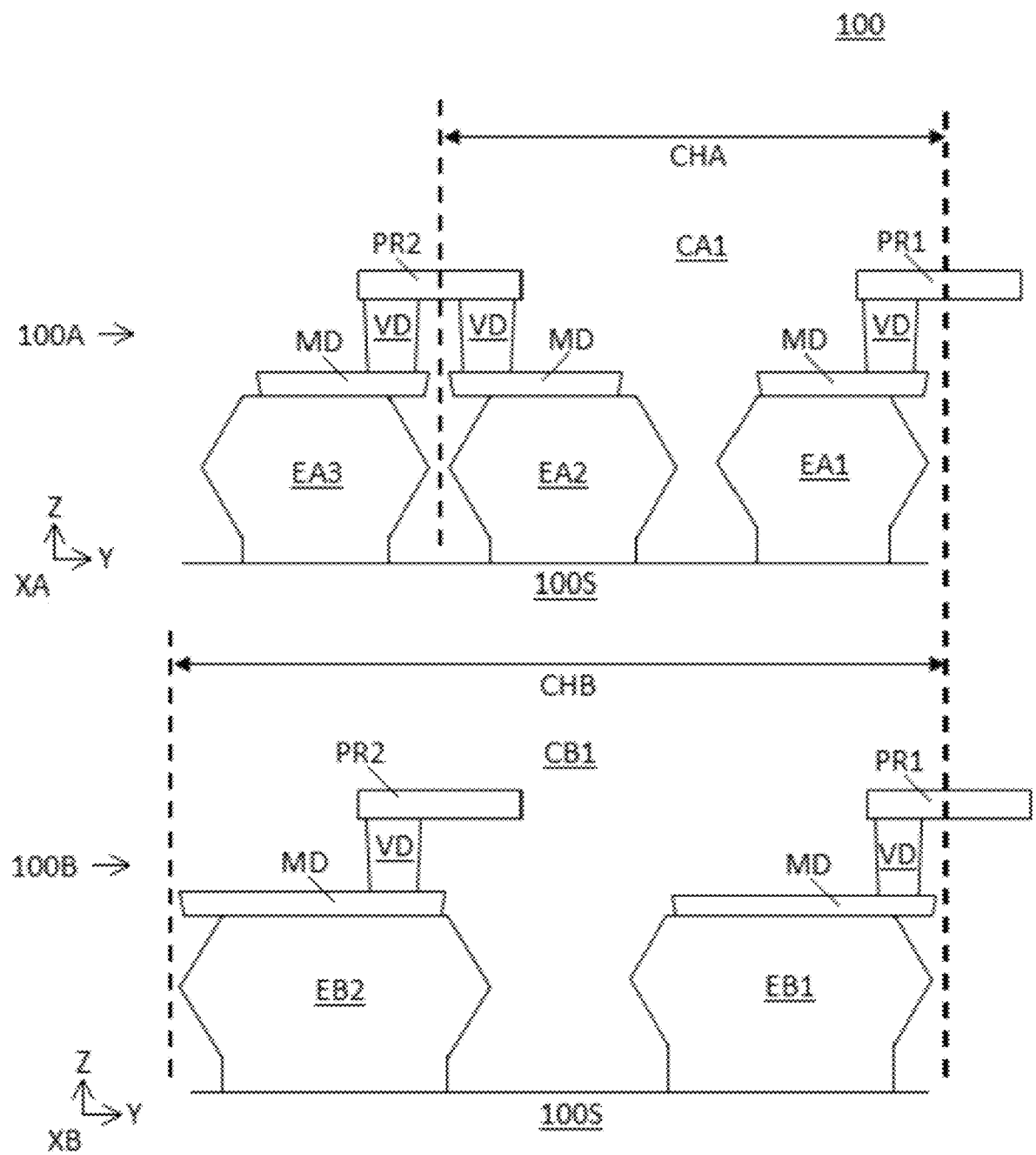
FIG. 3 is a diagram of an IC device, in accordance with some embodiments.

As discussed below, FIGS. 1A-2C depict plan views of some embodiments, FIG. 3 depicts cross-sectional views of some embodiments, FIGS. 4A-4E depict non-limiting examples of cell configurations, and FIGS. 5-8 depict features related to manufacturing-related embodiments.

Each of FIGS. 1A-4E discussed below is a structure/layout diagram in which the reference designators represent both IC structure features and IC layout features used to at least partially define the corresponding IC structure features in a manufacturing process, e.g., a method 500 discussed below with respect to FIG. 5 and/or an IC manufacturing flow associated with an IC manufacturing system 800 discussed below with respect to FIG. 8. In some embodiments, one or more of FIGS. 1A-4E is some or all of an IC layout diagram generated by executing some or all of the operations of a method 600 discussed below with respect to FIG. 6. Accordingly, each of FIGS. 1A-4E represents both an IC layout diagram and a plan or cross-sectional view of a corresponding structure as viewed from the corresponding perspective.

Each of the figures herein, e.g., FIGS. 1A-4E, is simplified for the purpose of illustration. The figures are views of IC structures and devices with various features included and excluded to facilitate the discussion below. In various embodiments, an IC structure, device and/or layout diagram includes one or more features corresponding to power distribution structures, metal interconnects, contacts, vias, gate structures or other transistor elements, isolation structures, or the like, in addition to the features depicted in FIGS. 1A-4E.

FIGS. 1A and 1B are schematic diagrams of an IC device 100, in accordance with some embodiments. FIG. 1A depicts a top-level plan view of IC device 100 and includes X and Y directions. FIG. 1B depicts a plan view of a portion of IC device 100, the X and Y directions, and lines A-A' and B-B' corresponding to cross-sectional views discussed below with respect to FIG. 3.

IC device 100 includes a region 100A and a region 100B. Region 100A includes rows of cells (not shown individually in FIGS. 1A and 1B) having a cell height CHA in the Y direction, also referred to as a pitch CHA in some embodiments, and region 100B includes rows of cells having a cell height CHB in the Y direction, also referred to as a pitch CHB in some embodiments. In the embodiment depicted in FIGS. 1A and 1B, region 100A abuts region 100B in the X direction such that a subset or all of the rows of cells in region 100A are aligned in the X direction with a subset or all of the rows of cells in region 100B along at least one border, e.g., a border 100AB, extending in the Y direction. In some embodiments, a subset or all of the rows of cells in region 100A are aligned in the X direction with a subset or all of the rows of cells in region 100B and are separated by a third region of IC device 100, e.g., an isolation structure.

Three rows of cells in region 100A have a total height of 3× cell height CHA equal to 2× cell height CHB, a total height of two rows of cells in region 100B. Accordingly, a ratio of cell height CHB to cell height CHA, also referred to as a pitch ratio of pitch CHB to pitch CHA in some embodiments, is equal to 3:2. In embodiments in which an IC layout diagram includes the pitch ratio equal to 3:2, the pitch ratio of IC device 100 manufactured in accordance with the IC layout diagram has a value within a manufacturing tolerance of 3:2, otherwise referred to as being approximately equal to 3:2 in some embodiments.

The embodiment of IC device 100 depicted in FIG. 1A is simplified for the purpose of illustration. In the embodiment depicted in FIG. 1A, a single instance of region 100A includes a total of eight rows of cells and surrounds a single instance of region 100B including two rows of cells. In various embodiments, IC device 100 includes more than one instance of one or both of regions 100A or 100B, and/or an instance of one of regions 100A or 100B surrounds zero, one, or multiple instances of the other of regions 100A or 100B. In various embodiments, a given instance of region 100A or 100B includes a total number of rows of cells equal to one, two, or three or more.

In the embodiment depicted in FIG. 1A, entireties of IC device 100 and each of regions 100A and 100B include rows of cells. In various embodiments, one or more of IC device 100, region 100A, or region 100B includes one or more unused portions, e.g., a gap in the X direction between cells of a given row of cells or a gap in the Y direction equal to one half of cell height CHA and corresponding to an odd number of rows of cells in region 100B. In some embodiments, IC device 100 includes one or more gaps corresponding to one or more features in addition to regions 100A and 100B, e.g., an IC structure such as a capacitive device having a configuration independent of rows of cells.

FIG. 1B depicts portions of each of regions 100A and 100B along border 100AB. The portion of region 100A includes cell rows CA1-CA3 (indicated by dashed borders), each having cell height CHA, and the portion of region 100B includes cell rows CB1 and CB2, each having cell height CHB. In various embodiments, one or more of cell rows CA1-CA3 includes a single cell or more than one cell, and/or one or more of cell rows CB1 or CB2 includes a single cell or more than one cell.

Cell row CA1 includes active areas AA1 and AA2; cell row CA2 includes active areas AA3 and AA4; cell row CA3 includes active areas AA5 and AA6; cell row CB1 includes active areas AB1 and AB2; and cell row CB2 includes active areas AB3 and AB4.

An active area (region), e.g., an active area AA1-AA6 or AB1-AB4, is a region in an IC layout diagram, e.g., an IC layout diagram corresponding to IC device 100, included in a manufacturing process as part of defining an active area (structure, also referenced by an active area AA1-AA6 or AB1-AB4), also referred to as an oxide diffusion or definition (OD), in a semiconductor substrate, e.g., a substrate 100S discussed below with respect to FIG. 3, in which one or more IC device features, e.g., a source/drain region, is formed. In some embodiments, an active area is an n-type or p-type active area of a planar transistor, a fin field-effect transistor (FinFET), or a gate-all-around (GAA) transistor. In various embodiments, an active area (structure) includes one or more of a semiconductor material, e.g., silicon (Si), silicon-germanium (SiGe), silicon-carbide (SiC), or the like, or a dopant material, e.g., boron (B), phosphorous (P), arsenic (As), gallium (Ga), or another suitable material.

In some embodiments, an active area is a region in an IC layout diagram included in a manufacturing process as part of defining a nano-sheet structure, e.g., a continuous volume of one or more layers of one or more semiconductor materials having either n-type or p-type doping. In various embodiments, individual nano-sheet layers include a single monolayer or multiple monolayers of a given semiconductor material.

Each of active areas AA1, AA4, AA5, AB1, and AB3 is one of the n-type or p-type, and each of active areas AA2, AA3, AA6, AB2, and AB4 is the other of the n-type or p-type. At border 100AB, active area AA1 is continuous with active area AB1, active area AA3 is continuous with active area AB2, active area AA4 is continuous with active area AB3, active area AA6 is continuous with active area AB4, and each of active areas AA2 and AA5 is discontinuous.

In the embodiment depicted in FIG. 1B, each of the continuous active area pairs AA1/AB1, AA3/AB2, AA4/AB3, and AA6/AB4 includes one of a top or bottom edge aligned in the X direction at border 100AB such that the edge is continuous at border 100AB, and the other of the bottom or top edge unaligned in the X direction such that the other edge has a discontinuity at border 100AB. In some embodiments, one or more of the continuous active area pairs AA1/AB1, AA3/AB2, AA4/AB3, or AA6/AB4 does not include a top or bottom edge aligned in the X direction at border 100AB, each of the top and bottom edges thereby including a discontinuity at border 100AB.

In some embodiments, as discussed below with respect to FIGS. 2A-2C, the n-type active areas are located in p-wells (not shown in FIG. 1B) and/or the p-type active areas are located in n-wells. In some embodiments, one or both of regions 100A or 100B of IC device 100 are free from including an n-well or a p-well.

Power rails PR1-PR4 extend in the X direction across border 100AB. In the embodiment depicted in FIG. 2B, power rail PR1 extends along top borders of cell rows CA1 and CB1 and overlies active areas AA1 and AB1; power rail PR2 extends along the border between cell rows CA1 and CA2 overlying active areas AA2 and AA3, and into cell row CB1 overlying active area AB2; power rail PR3 extends along the border between cell rows CA2 and CA3 overlying active areas AA4 and AA5, and into cell row CB2 overlying active area AB3; and power rail PR4 extends along bottom borders of cell rows CA3 and CB2 overlying active areas AA6 and AB4. In some embodiments, one or more of power rails PR1-PR4 does not overlie one or more corresponding ones of active areas AA1-AA4, AB1, or AB4, e.g., is adjacent to the one or more corresponding ones of active areas AA1-AA4, AB1, or AB4 in the Y direction.

A power rail, e.g., a power rail PR1-PR4, is a region in an IC layout diagram, e.g., the IC layout diagram corresponding to IC device 100, included in the manufacturing process as part of defining a conductive structure. A conductive structure includes one or more conductive materials such as polysilicon, copper (Cu), aluminum (Al), tungsten (W), cobalt (Co), ruthenium (Ru), or one or more other metals, and/or one or more other materials suitable for providing a low resistance path for a power supply or reference, e.g., ground, voltage. In some embodiments, a power rail corresponds to a first metal layer, e.g., a metal zero or metal one layer, of the manufacturing process.

In embodiments in which each of active areas AA1, AA4, AA5, AB1, and AB3 is the n-type and each of active areas AA2, AA3, AA6, AB2, and AB4 is the p-type, power rails PR1 and PR3 are configured to carry the reference voltage and power rails PR2 and PR4 are configured to carry the power supply voltage. In embodiments in which each of active areas AA1, AA4, AA5, AB1, and AB3 is the p-type and each of active areas AA2, AA3, AA6, AB2, and AB4 is the n-type, power rails PR1 and PR3 are configured to carry the power supply voltage and power rails PR2 and PR4 are configured to carry the reference voltage.

By the configuration discussed above and further discussed below with respect to FIGS. 2A-4E, IC device 100 includes cell rows CA1-CA3 in region 100A abutting cell rows CB1 and CB2 in region 100B, and a ratio of pitch CHB to pitch CHA is 3:2. IC device 100 is thereby capable of including groups of relatively taller cells stacked in multiple rows separate from groups of relatively shorter cells stacked in multiple rows such that circuit efficiency is improved compared to approaches that do not include adjacent regions having a 3:2 pitch ratio.

FIGS. 2A-2C are diagrams of a portion of IC device 100, in accordance with some embodiments. Each of FIGS. 2A-2C depicts cell rows CA1 and CA2 of region 100A abutting cell row CB1 and a portion of cell row CB2 of region 100B along border 100AB, and the X and Y directions. In each of the embodiments depicted in FIGS. 2A-2C, continuous active areas AA1 of cell row CA1 and AB1 of cell row CB1 are located in a well W1 continuous across border 100AB, and each of active area AA2 of cell row CA1 and continuous active areas AA3 of cell row CA2 and AB2 of cell row CB1 are located in a well W2 continuous across border 100AB.

Well W1 is a first one of an n-type well or a p-type well corresponding to active areas AA1 and AB1 being the opposite p-type or n-type, and well W2 is the other of the n-type well or the p-type well corresponding to active areas AA2, AA3, and AB2 being the opposite p-type or n-type. In some embodiments, one of wells W1 or W2 being the n-type well corresponds to the other of wells W1 or W2 being a p-type substrate or epitaxial layer, or one of wells W1 or W2 being the p-type well corresponds to the other of wells W1 or W2 being an n-type substrate or epitaxial layer.

Each of FIGS. 2A-2C depicts a single instance of each of wells W1 and W2 for the purpose of illustration. In various embodiments, IC device 100 includes one or more additional instances of well W1, e.g., an instance in which continuous active areas AA4 of cell row CA2 and AB3 of cell row CB2 are located, and/or one or more additional instances of well W2. In each of the embodiments discussed below with respect to FIGS. 2A-2C, well W2 in region 100A has a width WWA in the Y direction greater than a width WWB in region 100B.

Wells W1 and W2, and in some embodiments active areas AB1-AB3, have configurations at border 100AB corresponding to various embodiments of IC device 100, as discussed below with respect to FIGS. 2A-2C. In some embodiments, the configuration is based on the layout design of IC device 100 conforming to one or more minimum spacing rules applied to one or both of wells W1 or W2 in combination with one or more of active areas AA1, AA2, AB1, or AB2.

Each of FIGS. 2A-2C includes active areas AA1-AA4 having a width WA in the Y direction, and active areas AB1-AB3 having a width WB in the Y direction, width WB being greater than width WA. As active area width increases, overall transistor channel width is capable of increasing such that current, power, and speed also increase. Width WB being greater than width WA thereby corresponds to region 100B including transistors that are larger, faster, and capable of handling greater power and generating more heat than transistors included in region 100A.

In some embodiments width WB is greater than width WA by a factor ranging from 1.5 to 10. In some embodiments, width WB is greater than width WA by a factor ranging from 2 to 5. In some embodiments, width WA has a value ranging from 10 nanometers (nm) to 30 nm. In some embodiments, width WB has a value ranging from 30 nm to 60 nm.

In the embodiments depicted in FIGS. 2A-2C, each of the active areas, e.g., active areas AA1-AA4, in region 100A has a same value of width WA, and each of the active areas, e.g., active areas AB1-AB3, in region 100B has a same value of width WB. In various embodiments, one or more of the active areas in region 100A has a value different from one or more values of one or more other active areas of region 100A, and/or one or more of the active areas in region 100B has a value different from one or more values of one or more other active areas of region 100B.

In the embodiment depicted in FIG. 2A, wells W1 and W2 share a border (not labeled) that extends in the X direction between active areas AA1 and AA2 in region 100A, between active areas AB1 and AB2 in region 100B, and includes a discontinuity at border 100AB. An entirety of well W1 is located higher than active area AA2 in the Y direction, and an entirety of well W2 is located lower than active area AB1 in the Y direction.

In the embodiment depicted in FIG. 2A, the border in region 100A is located higher than the border in region 100B in the Y direction such that width WWA is greater than width WWB and an offset O1 in the Y direction corresponds to the discontinuity. In some embodiments, offset O1 corresponds to the border in region 100B being located higher than the border in region 100A in the Y direction such that width WWB is greater than width WWA.

In some embodiments, the border does not include a discontinuity at border 100AB, width WWA is equal to width WWB, and offset O1 has a value of zero. In various embodiments, offset O1 has a value that enables each of wells W1 and W2 to be a continuous well conforming to minimum spacing rules for distances between the border and active areas AA1 and AA2 in region 100A and between the border and active areas AB1 and AB2 in region 100B. In some embodiments, offset O1 has a value ranging from greater than 0 nm to 20 nm. In some embodiments, offset O1 has a value ranging from greater than 0 nm to 10 nm.

In the embodiment depicted in FIG. 2B, the border between wells W1 and W2 in region 100A is aligned with a bottom edge of active area AB1 in the X direction, and the border between wells W1 and W2 in region 100B is aligned with active area AA2 in the X direction such that a portion of well W1 is lower than a portion of active area AA2 in the Y direction and width WWA is greater than width WWB.

In the embodiment depicted in FIG. 2B, an offset O2 in the Y direction corresponds to the discontinuity in the border and includes portions of each of well W2 and active area AA2 in region 100A aligned in the X direction with a portion of well W1 in region 100B. In some embodiments, offset O2 includes an entirety of active area AA2 in region 100A aligned in the X direction with a portion of well W1 in region 100B.

In various embodiments, offset O2 has a value that enables each of wells W1 and W2 to be a continuous well conforming to minimum spacing rules for distances between the border and active areas AA1 and AA2 in region 100A and between the border and active areas AB1 and AB2 in region 100B. In some embodiments, offset O2 has a value that enables width WB to accommodate a targeted feature size, e.g., a number of fins. In some embodiments, offset O2 has a value ranging from 5 nm to 50 nm. In some embodiments, offset O2 has a value ranging from 10 nm to 30 nm.

In the embodiment depicted in FIG. 2C, a middle portion of each of active areas AB1-AB3 has width WB and end portions of each of active areas AB1-AB3 has width WA. Each of the active area pairs AA1/AB1, AA3/AB2, and AA4/AB3 thereby includes each of the top and bottom edge aligned in the X direction at border 100AB such that each edge is continuous at border 100AB.

The end portions of active areas AB1-AB3 having width WA extend away from border 100AB in the X direction by an offset O3. In the embodiment depicted in FIG. 2C, offsets O3 of each active area, e.g., active area AB1-AB3, in region 100B has a same value. In some embodiments, one or more active areas of region 100B has an offset O3 value different from one or more offset O3 values of one or more other active areas of region 100B.

In some embodiments, offset O3 has a value equal to one half of a gate pitch of IC device 100, also referred to as a cell poly pitch (CPP) in some embodiments. The gate pitch corresponds to a spacing between adjacent gate structures of IC device 100, and offset O3 having the value equal to one half of the gate pitch facilitates uniformity between regions 100A and 100B, thereby supporting manufacturability in some embodiments.

In the embodiment depicted in FIG. 2C, IC device 100 includes the borders between wells W1 and W2 in regions 100A and 100B aligned in the X direction as discussed above with respect to FIG. 2B, with the exception of the border in region 100B being offset from border 100AB in the X direction by a distance less than offset O3. Well W2 thereby includes a first portion in region 100B adjacent to border 100AB having width WWA and a second portion in region 100B having width WWB. An entirety of active area AA2 is thereby aligned in the X direction with the first portion of well W2 in region 100B.

In each of the embodiments depicted in FIGS. 2A-2C, well W2 and another well (not shown) located below well W2 in the Y direction, e.g., a second instance of well W1 inverted in the Y direction, share a border that extends in the X direction and is continuous at border 100AB. In some embodiments, the shared border includes a discontinuity at border 100AB such that an offset (not shown) exists in the Y direction.

By the configurations discussed above with respect to FIGS. 2A-2C, IC device 100 is capable of including cell rows CA1-CA3 in region 100A abutting cell rows CB1 and CB2 in region 100B as discussed above and thereby capable of realizing the benefits discussed above with respect to FIGS. 1A and 1B.

FIG. 3 a diagram of IC device 100, in accordance with some embodiments. FIG. 3 includes the Y direction and a Z direction, and depicts cross-sectional views corresponding to two Y-Z planes: a Y-Z plane at an X-coordinate location XA corresponding to cell row CA1 of region 100A and line A-A' depicted in FIG. 1B, and a Y-Z plane at an X-coordinate location XB corresponding to cell row CB1 of region 100B and line B-B' depicted in FIG. 1B. The two Y-Z planes are therefore separated by border 100AB (not shown in FIG. 3).

The cross-sectional view of region 100A includes cell height CHA, the cross-sectional view of region 100B includes cell height CHB, and each of the cross-sectional views includes power rails PR1 and PR2, each discussed above with respect to FIGS. 1A and 1B. Each of the cross-sectional views also includes instances of vias VD below power rails PR1 and PR2 in the Z direction, instances of conductive regions MD below the instances of vias VD in the Z direction, and substrate 100S. The cross-sectional view of region 100A includes instances of epitaxial structures EA1-EA3 between the instances of conductive regions MD and substrate 100S, and the cross-sectional view of region 100B includes instances of epitaxial structures EB1 and EB2 between the instances of conductive regions MD and substrate 100S.

An epitaxial layer, e.g., epitaxial layer EA1-EA3, EB1, or EB2, also referred to as a source/drain (S/D) region in some embodiments, is a volume including one or more semiconductor materials having a crystalline structure distinct from that of substrate 100S, e.g., by including one or more materials, having a different doping type, and/or having an orientation different from those of substrate 100S.

A conductive region MD is a region in the IC layout diagram included in the manufacturing process as part of defining a metal-like segment, also referred to as a conductive or MD segment or MD conductive line or trace, in and/or on a semiconductor substrate, e.g., substrate 100S, and/or an S/D structure, e.g., epitaxial layer EA1-EA3, EB1, or EB2. In some embodiments, an MD segment includes a portion of at least one metal layer, e.g., a contact layer, overlying and contacting the substrate and having a thickness sufficiently small to enable formation of an insulation layer between the MD segment and an overlying metal layer, e.g., a first metal layer. In various embodiments, an MD segment includes one or more of copper (Cu), silver (Ag), tungsten (W), titanium (Ti), nickel (Ni), tin (Sn), aluminum (Al) or another metal or material suitable for providing a low resistance electrical connection between IC structure elements. In various embodiments, an MD segment includes an epitaxial layer having a doping level, e.g., based on an implantation process, sufficient to cause the segment to have the low resistance level. In various embodiments, a doped MD segment includes one or more of Si, SiGe, SiC, B, P, As, Ga, a metal, or another material suitable for providing the low resistance level. In various embodiments, a conductive region MD at least partly defines an MD segment corresponding to a portion or all of one or more S/D structures included in one or more transistors.

A via, e.g., a via VD, is a region in the IC layout diagram, e.g., the IC layout diagram corresponding to IC device 100, included in the manufacturing process as part of defining a via structure including one or more conductive materials as discussed above with respect to power rails PR1-PR4. The via structure is configured to provide an electrical connection between an overlying conductive structure, e.g., a power rail, and an underlying conductive structure, e.g., a conductive region MD.

In the embodiment depicted in FIG. 3, cell row CA1 includes epitaxial layer EA1 electrically connected to power rail PR1 through first instances of conductive region MD and via VD, and epitaxial layer EA2 electrically connected to power rail PR2 through second instances of conductive region MD and via VD. A first portion of power rail PR1 overlies epitaxial layer EA1, and a second portion of power rail PR1 extends out of cell row CA1 in the Y direction and overlies substrate 100S. A first portion of power rail PR2 overlies epitaxial layer EA2, and a second portion of power rail PR2 extends out of cell row CA1 in the Y direction and overlies substrate 100S between epitaxial layers EA2 and EA3. Cell row CA1 is thereby free from including an entirety of a width in the Y direction of either of power rails PR1 or PR2, and free from including a portion of either of power rails PR1 or PR2 overlying substrate 100S between epitaxial layers EA1 and EA2.

Cell row CB1 includes epitaxial layer EB1 electrically connected to power rail PR1 through third instances of conductive region MD and via VD, and epitaxial layer EB2 electrically connected to power rail PR2 through fourth instances of conductive region MD and via VD. A first portion of power rail PR1 overlies epitaxial layer EB1, and a second portion of power rail PR1 extends out of cell row CB1 in the Y direction and overlies substrate 100S. A first portion of power rail PR2 overlies epitaxial layer EB2, and a second portion of power rail PR2 extends within cell row CB1 in the Y direction and overlies substrate 100S between epitaxial layers EB1 and EB2. Cell row CB1 thereby includes an entirety of the width in the Y direction of power rail PR2, and includes the second portion of power rail PR2 overlying substrate 100S between epitaxial layers EB1 and EB2.

By the configuration discussed above with respect to FIG. 3, IC device 100 is capable of including cell rows CA1-CA3 in region 100A abutting cell rows CB1 and CB2 in region 100B as discussed above and thereby capable of realizing the benefits discussed above with respect to FIGS. 1A and 1B.

Figure 4A:
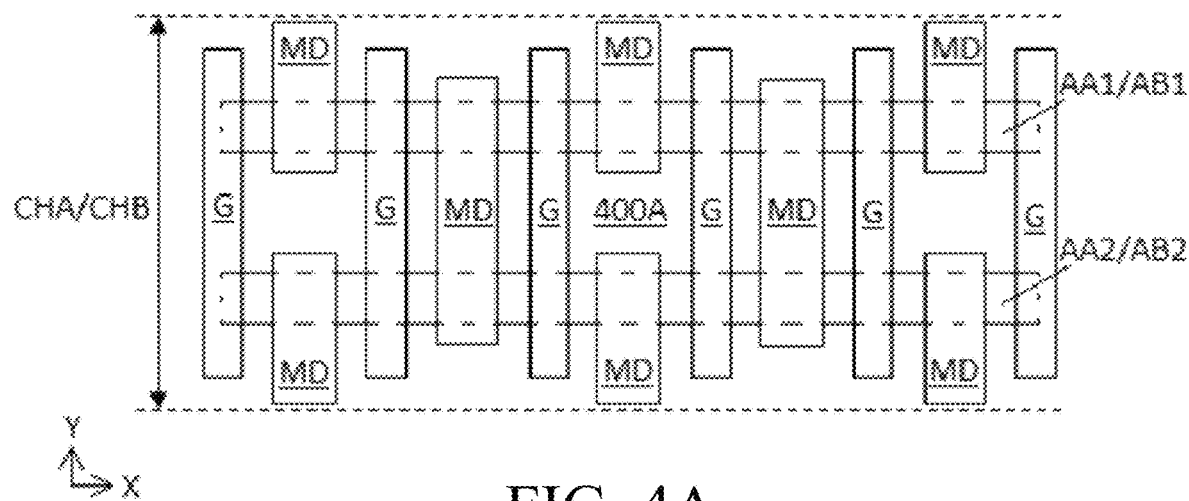
FIGS. 4A-4E are diagrams of IC devices, in accordance with some embodiments.
Figure 4B:
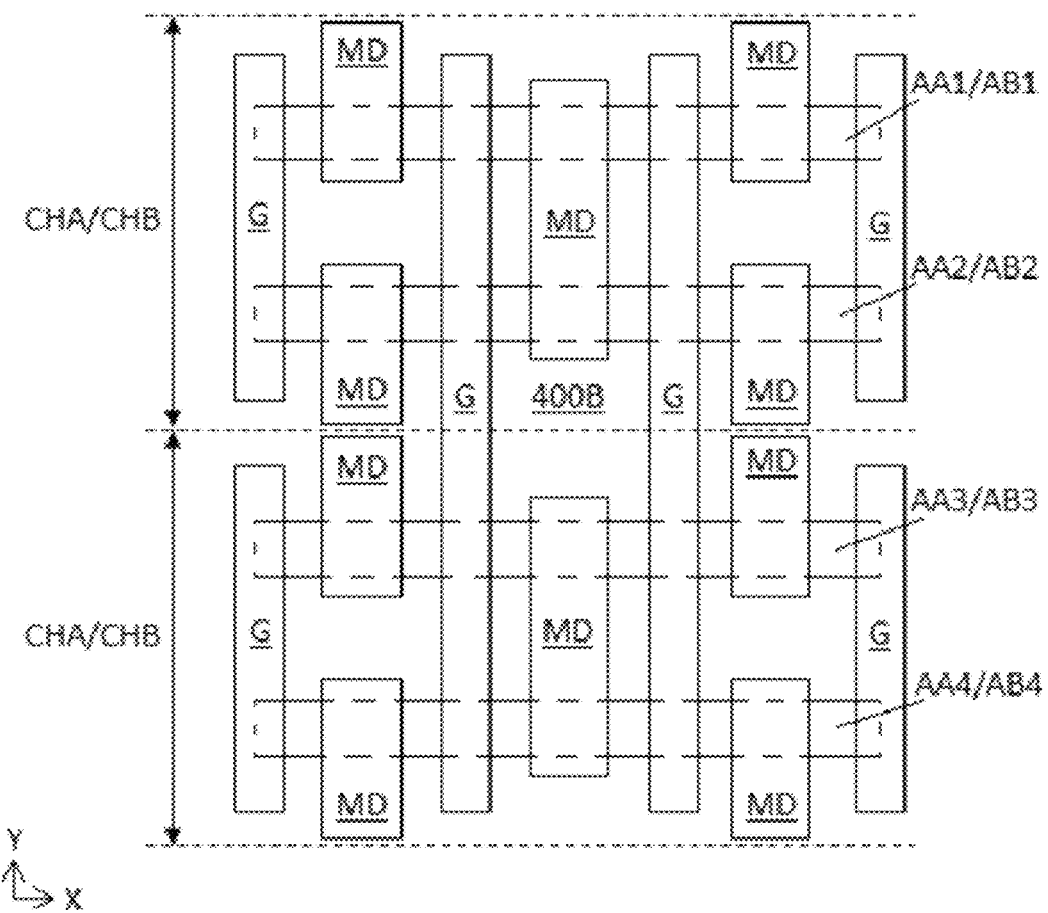
Figure 4C:
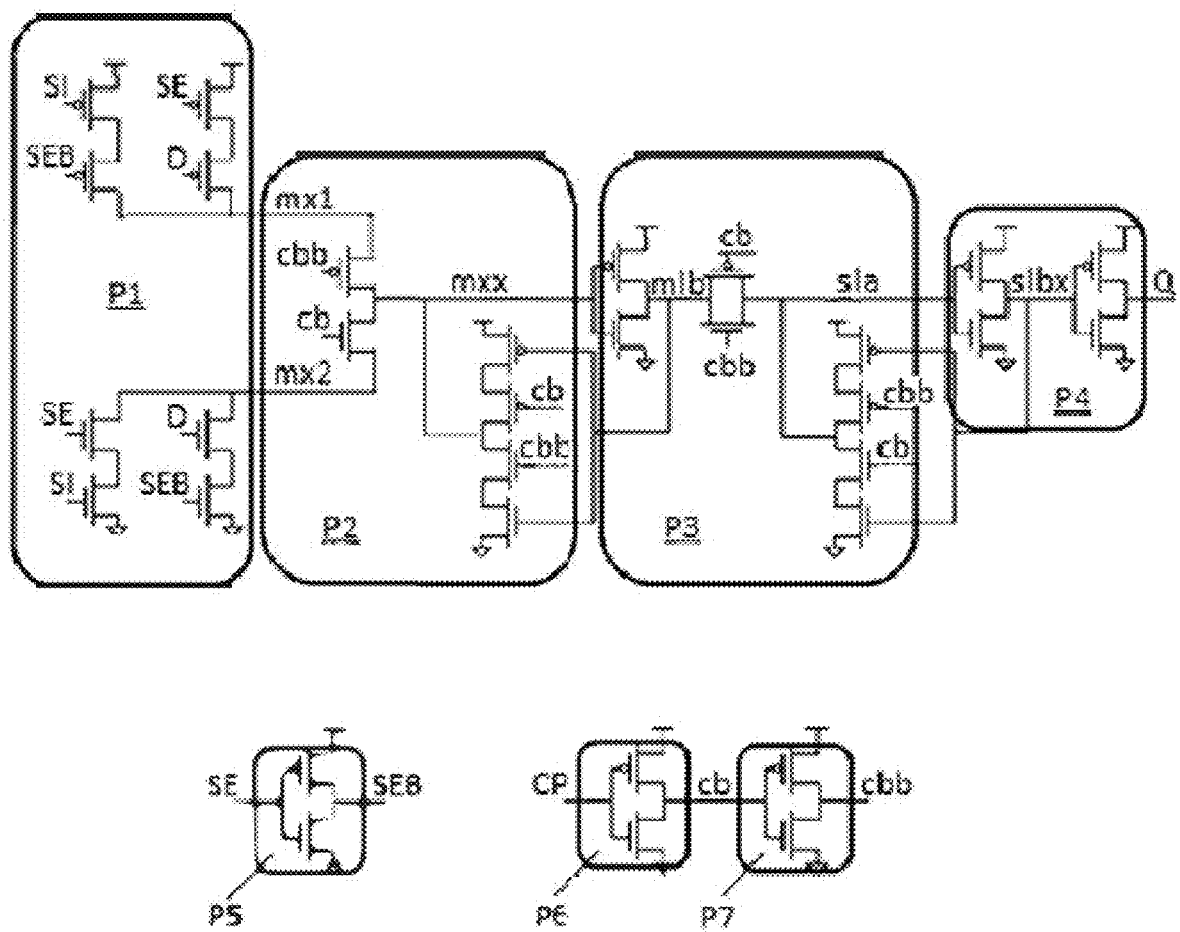
Figure 4D:
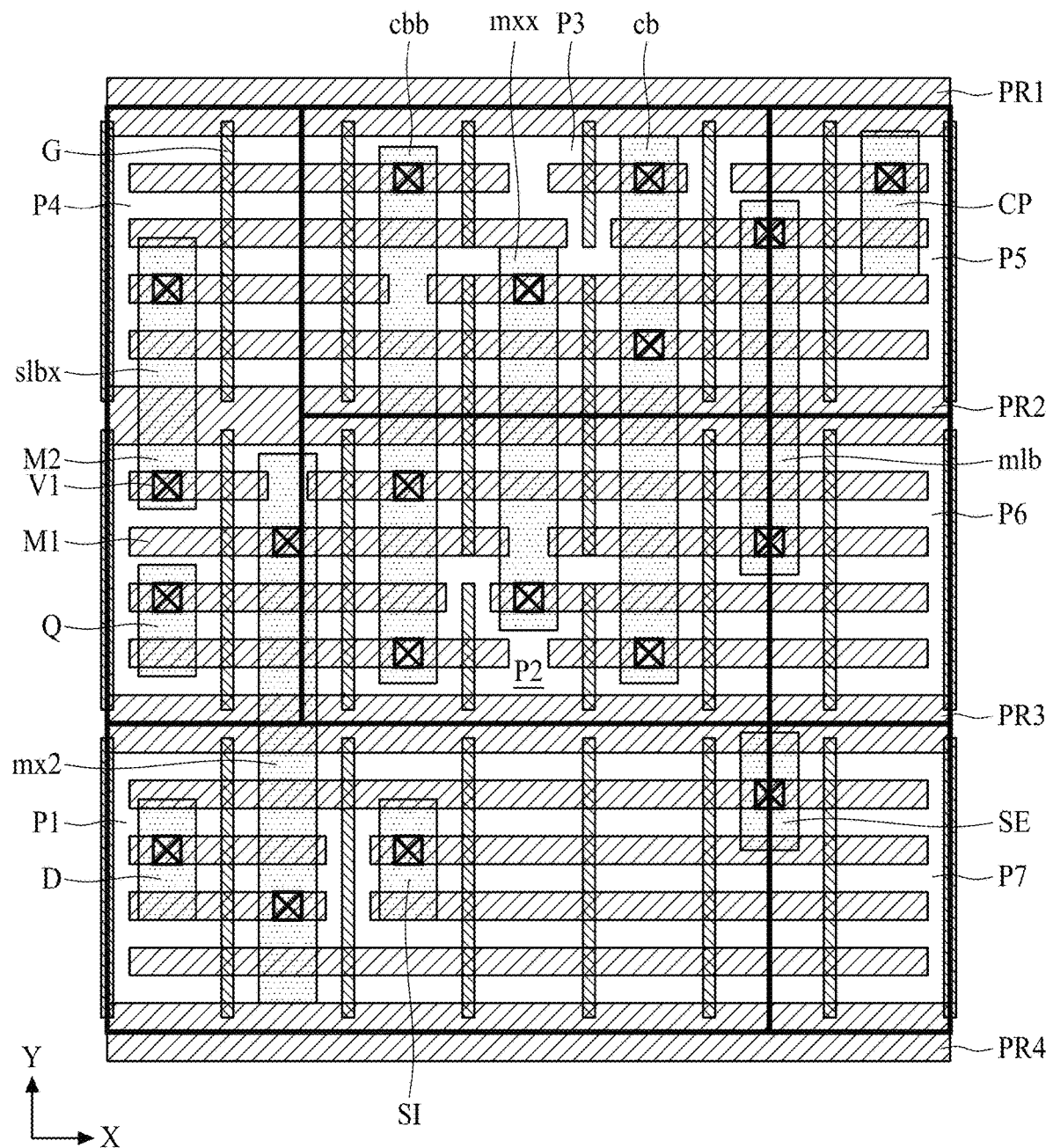
Figure 4E:
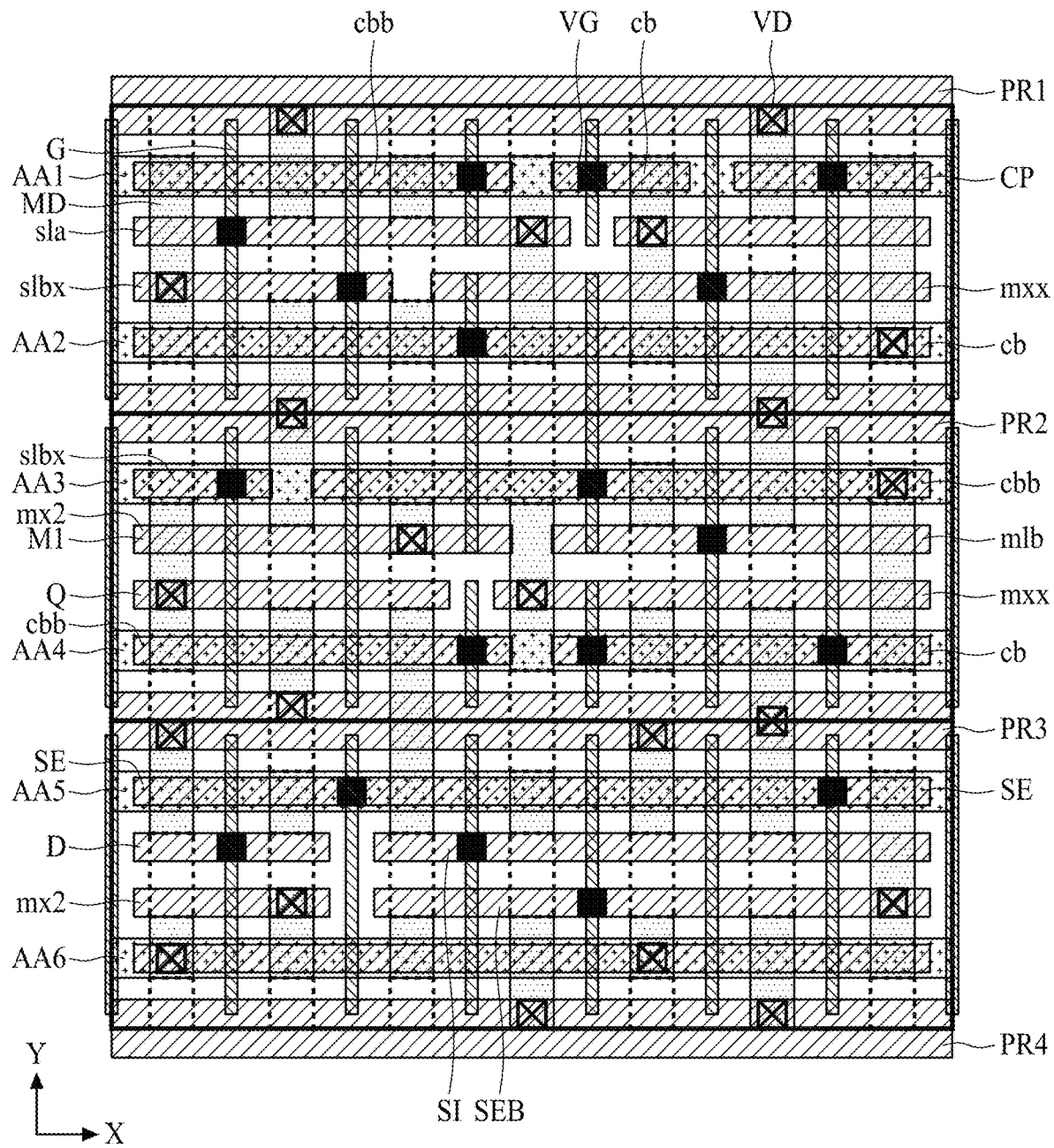

FIGS. 4A-4E are diagrams of IC devices 400A-400C, in accordance with some embodiments. IC device 400A depicted in FIG. 4A is a non-limiting example of a single-cell height inverter array capable of being included in either of regions 100A or 100B; IC device 400B depicted in FIG. 4B is a non-limiting example of a double-cell height inverter array capable of being included in either of regions 100A or 100B; and IC device 400C depicted in FIGS. 4C-4E is a non-limiting example of a triple-cell height flip-flop capable of being included in region 100A.

In the non-limiting example depicted in FIG. 4A, IC device 400A either includes active areas AA1 and AA2 and has cell height CHA corresponding to region 100A, or includes active areas AB1 and AB2 and has cell height CHB corresponding to region 100B. IC device 400A includes three instances of conductive region MD overlying active region AA1 or AB1, three instances of conductive region MD overlying active region AA2 or AB2, two instances of conductive region MD overlying both of active regions AA1 and AA2 or AB1 and AB2, and six instances of a gate G overlying both of active regions AA1 and AA2 or AB1 and AB2.

A gate, e.g., gate G, is a region in the IC layout diagram, e.g., the IC layout diagram corresponding to IC device 100, included in the manufacturing process as part of defining a gate structure. A gate structure is a volume including one or more conductive segments, e.g., a gate electrode, including one or more conductive materials, e.g., polysilicon, one or more metals, and/or one or more other suitable materials, substantially surrounded by one or more insulating materials, the one or more conductive segments thereby being configured to control a voltage provided to an underlying gate dielectric layer.

A dielectric layer, e.g., a gate dielectric layer, is a volume including one or more insulating materials, e.g., silicon dioxide and/or one or more other suitable material such as a low-k material having a k value less than 3.8 or a high-k material having a k value greater than 3.8, suitable for providing a high electrical resistance between IC structure elements, i.e., a resistance level above a predetermined threshold corresponding to one or more tolerance levels of a resistance-based effect on circuit performance.

In addition to the features depicted in FIG. 4A, IC device 400A includes conductive features, e.g., instances of vias such as via VD discussed above with respect to FIG. 3, configured to provide electrical connections between instances of conductive region MD and power rails PR1 and PR2, and among instances of gate G and conductive region MD and one or more conductive segments configured to propagate one or more electrical signals. IC device 400A includes the features depicted in FIG. 4A and the additional features arranged as an array of four inverters.

In the non-limiting example depicted in FIG. 4B, IC device 400B either includes active areas AA1-AA4 and has twice cell height CHA corresponding to region 100A, or includes active areas AB1-AB4 and has twice cell height CHB corresponding to region 100B. IC device 400B includes two instances of conductive region MD overlying active region AA1 or AB1, two instances of conductive region MD overlying active region AA2 or AB2, two instances of conductive region MD overlying active region AA3 or AB3, two instances of conductive region MD overlying active region AA4 or AB4, one instance of conductive region MD overlying both of active regions AA1 and AA2 or AB1 and AB2, one instance of conductive region MD overlying both of active regions AA3 and AA4 or AB3 and AB4, two instances of gate G overlying both of active regions AA1 and AA2 or AB1 and AB2, two instances of gate G overlying both of active regions AA3 and AA4 or AB3 and AB4, and two instances of gate G overlying each of active areas AA1-AA4 or AB1-AB4.

In addition to the features depicted in FIG. 4B, IC device 400B includes conductive features, e.g., instances of vias such as via VD discussed above with respect to FIG. 3, configured to provide electrical connections between instances of conductive region MD and subsets of power rails PR1-PR4, and among instances of gate G and conductive region MD and one or more conductive segments configured to propagate one or more electrical signals. IC device 400B includes the features depicted in FIG. 4B and the additional features arranged as an array of four inverters.

By the configurations discussed above, each of IC devices 400A and 400B includes some or all of active areas AA1-AA4 of region 100A of IC device 100 or some or all of active areas AB1-AB4 of region 100B of IC device 100. IC device 400A implemented in region 100A is thereby configured to have device performance equivalent to that of IC device 400B implemented in region 100A, and IC device 400A implemented in region 100B is thereby configured to have device performance equivalent to that of IC device 400B implemented in region 100B.

IC device 400A has a width in the X direction corresponding to five times a gate pitch of gates G and a height in the Y direction equal to a single cell height CHA or CHB, and IC device 400B has a width in the X direction corresponding to three times the gate pitch and a height in the Y direction equal to twice cell height CHA or CHB. IC device 400A is thereby capable of having a smaller area than that of IC device 400B. Because IC device 400B includes a total of ten instances of conductive region MD and IC device 400A includes a total of eight instances of conductive region MD, IC device 400B is capable of having greater routing flexibility than that of IC device 400A.

An IC device, e.g., IC device 100 discussed above with respect to FIGS. 1A-3, based on a design process including IC devices capable of being included in regions 100A and/or 100B, e.g., one or more instances of IC device 400A and/or 400B, is thereby capable of combining area and performance design objectives more efficiently than IC devices based on other design approaches. IC devices 400A and 400B are non-limiting examples provided for the purpose of illustration. In various embodiments, one or more IC devices having configurations other than those of IC devices 400A and 400B are capable of being included in regions 100A and/or 100B of IC device 100 and are thereby capable of combining area and performance design objectives more efficiently than IC devices based on other design approaches.

In the non-limiting example depicted in FIGS. 4C-4E, IC device 400C includes active areas AA1-AA6 and power rails PR1-PR4, each discussed above with respect to IC device 100 and FIGS. 1A-3. IC device 400C corresponds to a flip-flop circuit configured in accordance with a schematic diagram depicted in FIG. 4C, an arrangement of back-end-of-line (BEOL) features depicted in FIG. 4D, and an arrangement of middle-end-of-line (MEOL) and/or front-end-of-line (FEOL) features depicted in FIG. 4E.

As illustrated in the schematic diagram of FIG. 4C, IC device 400C includes circuit portions P1-P7, each of which includes one or more PMOS transistors (not labeled) and one or more NMOS transistors (not labeled). Portion P1 is a selection circuit configured to receive external signals SI, SE, and D, signal SEB from portion P5, and output signals mx1 and mx2 responsive to signals SI, SE, SEB, and D. Portion P2 is a master switch configured to receive signals mx1 and mx2 from portion P1, signal mlb from portion P3, clock signal cb from portion P6, and clock signal cbb from portion P7, and output signal mxx responsive to signals mx1 and mx2 and clock signals cb and cbb. Portion P3 is a slave switch configured to receive signal mxx from portion P2, signal slbx from portion P4, clock signal cb from portion P6, and clock signal cbb from portion P7, and output signals mlb and sla responsive to signals mxx and slbx and clock signals cb and cbb. Portion P4 is an output circuit configured to receive signal sla, and output signals slbx and Q responsive to signal sla. Portion P5 is an inverter configured to receive signal SE, and output signal SEB responsive to signal SE; portion P6 is an inverter configured to receive a clock signal CP, and output clock signal cb responsive to clock signal CP; and portion P7 is an inverter configured to receive clock signal cb, and output clock signal cbb responsive to clock signal cb.

As depicted in FIG. 4D, portions P1 and P7 of IC device 400C are located adjacent to each other between power rails PR4 and PR3, portions P2 and P6 are located adjacent to each other between power rails PR3 and PR2, portions P3 and P5 are located adjacent to each other between power rails PR2 and PR1, and portion P4 is located adjacent to portions P2 and P3 between power rails PR3 and PR1.

In addition to including corresponding portions of power rails PR1-PR4, each of portions P1-P7 of IC device 400C includes a portion or all of one or more instances each of gate G discussed above with respect to FIGS. 4A and 4B, a metal segment M1, a via V1, and a metal segment M2. For the purpose of clarity, a single instance of each of gate G, via V1, and metal segments M1 and M2 is labeled.

Metal segments M1 are conductive structures located in a same layer as that of power rails PR1-PR4, e.g., a first metal or metal zero layer. Metal segments M2 are conductive structures located in a metal layer above that of metal segments M1 and power rails PR1-PR4, e.g., a second metal or metal one layer. Vias V1 are via structures located between metal segments M1 and M2 and configured to electrically connect metal segments M1 and M2 to each other.

As depicted in FIG. 4E, IC device 400C also includes instances of conductive segments MD and vias VD discussed above with respect to FIG. 3, and a gate via VG. For the purpose of clarity, a single instance of each of conductive segment MD, via VD, and gate via VG is labeled.

Gate vias VG are via structures located between gates G and metal segments M1 and configured to electrically connect gate electrodes of gates G and metal segments M1 to each other.

IC device 400C has a width in the X direction corresponding to seven times a gate pitch of gates G and a height in the Y direction equal to three times cell height CHA. IC device 400C is thereby capable of having a smaller area than that of flip flop circuits in other approaches, e.g., approaches in which a height in the Y direction is equal to one or two times a cell height. IC device 400C is a non-limiting example provided for the purpose of illustration. In various embodiments, one or more IC devices having configurations other than that of IC device 400C include heights greater than two times a cell height and are thereby capable of having smaller area than approaches that do not include heights greater than two times a cell height.

An IC device, e.g., IC device 100 discussed above with respect to FIGS. 1A-3, based on a design process including IC device 400C as depicted in FIGS. 4C-4E capable of being included in region 100A is thereby capable of having a reduced area than IC devices based on other design approaches, e.g., approaches in which multiples of heights in the Y direction are limited to one or two.

Figure 5:
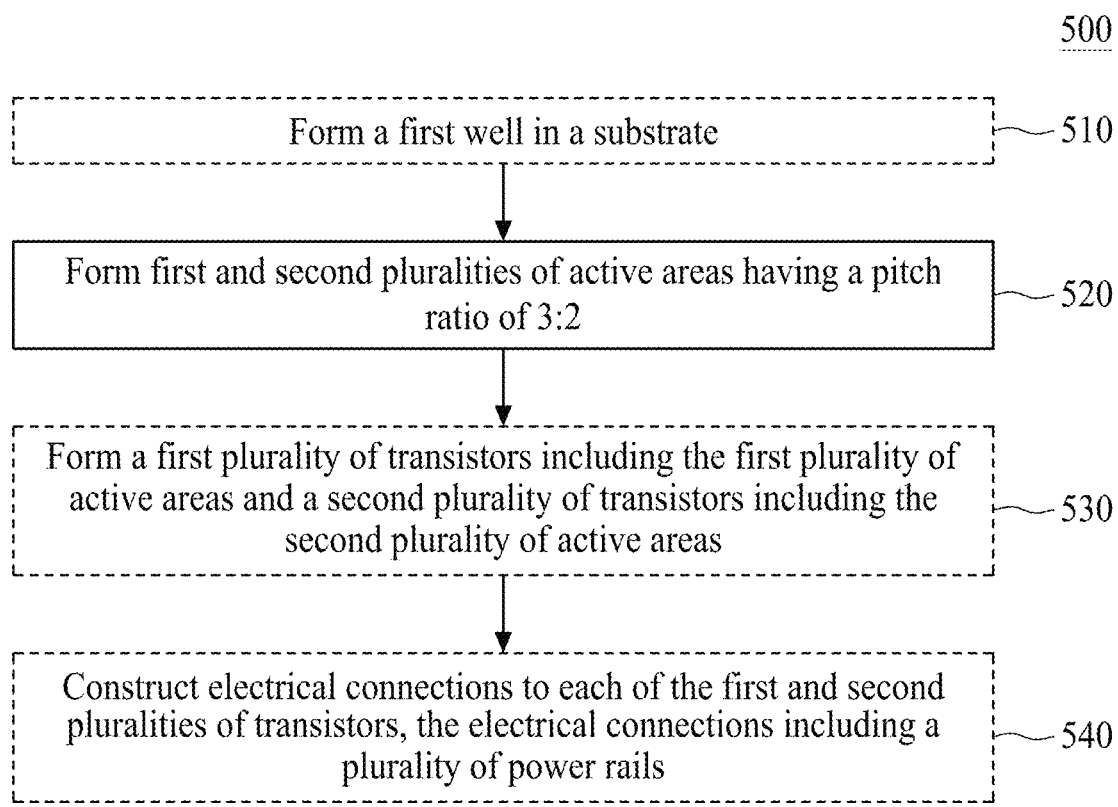
FIG. 5 is a flowchart of a method of manufacturing an IC device, in accordance with some embodiments.

FIG. 5 is a flowchart of a method 500 of manufacturing an IC device, in accordance with some embodiments. Method 500 is operable to form IC device 100 discussed above with respect to FIGS. 1A-3 and/or IC device 400A-400C discussed above with respect to FIGS. 4A-4E.

In some embodiments, the operations of method 500 are performed in the order depicted in FIG. 5. In some embodiments, the operations of method 500 are performed in an order other than the order of FIG. 5. In some embodiments, one or more additional operations are performed before, during, and/or after the operations of method 500.

In some embodiments, performing some or all of the operations of method 500 includes performing one or more operations as discussed below with respect to IC manufacturing system 800 and FIG. 8.

At operation 510, in some embodiments, a first well is formed in a semiconductor substrate. Forming the first well includes performing one or more manufacturing operations, e.g., a deposition, implantation, or other process suitable for forming a doped region in the substrate.

In various embodiments, forming the first well includes forming an n-well in a p-type substrate or epitaxial layer or forming a p-well in an n-type substrate or epitaxial layer. In some embodiments, forming the first well includes forming first and second wells in the substrate or epitaxial layer, the first and second wells including an n-well and a p-well.

In some embodiments, forming the first well includes forming the first well having a first width in a first region and a second width in a second region adjacent to the first region, the first width being greater than the second width. In some embodiments, forming the first well includes forming well W1 having width WWA in region 100A and having width WWB in region 100B as discussed above with respect to FIGS. 2A-2C. In some embodiments, forming the first well includes forming each of wells W1 and W2 in regions 100A and 100B as discussed above with respect to FIGS. 2A-2C.

In some embodiments, forming the first well includes forming a first portion in a first region and a second portion in a second region, the first and second portions being separated by an IC structure, e.g., an isolation structure.

At operation 520, first and second pluralities of active areas are formed in the substrate. Forming the first and second active areas includes performing one or more manufacturing operations, e.g., a deposition and/or an implantation process, in accordance with forming one or more active areas, e.g., active areas AA1-AA6 and AB1-AB4 as discussed above with respect to FIGS. 1A-4E.

Forming the first plurality of active areas includes the first plurality of active areas extending in a first direction and having a first pitch in a second direction perpendicular to the first direction, and forming the second plurality of active areas includes the second plurality of active areas extending in the first direction, offset from the first plurality of active areas in the first direction, and having a second pitch in the second direction. A ratio of the second pitch to the first pitch is 3:2.

In some embodiments, forming the first and second pluralities of active areas includes forming active areas AA1-AA6 having pitch CHA and forming active areas AB1-AB4 having pitch CHB as discussed above with respect to FIGS. 1A-3.

In some embodiments, forming the first plurality of active areas includes forming first and second active areas of the first plurality of active areas in the well, e.g., forming active areas AA2 and AA3 in well W1 as discussed above with respect to FIGS. 2A-2C, and forming the second plurality of active areas includes forming a first active area of the second plurality of active areas in the well and continuous with the first active area of the first plurality of active areas, e.g., forming active area AB2 in well W1 as discussed above with respect to FIGS. 2A-2C.

At operation 530, in some embodiments, a first plurality of transistors is formed including the first plurality of active areas and a second plurality of transistors is formed including the second plurality of active areas. Forming the transistors of the first and second pluralities of transistors includes performing a plurality of manufacturing operations, e.g., one or more of a lithography, diffusion, deposition, etching, planarizing, or other operation suitable for building a gate structure adjacent to source and drain structures and overlying an active area of a semiconductor wafer. In various embodiments, forming the first and second pluralities of transistors includes forming planar transistors, FinFET transistors, GAA transistors, or other suitable IC devices.

In various embodiments, forming the first and second pluralities of transistors includes performing one or more manufacturing operations in accordance with forming S/D structures in and/or on the first and second pluralities of active areas, e.g., epitaxial structures EA1-EA3, EB1, and EB2 as discussed above with respect to FIG. 3, conductive structures, e.g., conductive regions MD discussed above with respect to FIGS. 3-4E, on the S/D structures, gate structures, e.g., gates G discussed above with respect to FIGS. 4A-4E, and via structures, e.g., vias VD and VG discussed above with respect to FIGS. 3-4E.

At operation 540, in some embodiments, electrical connections to each of the first and second pluralities of transistors are constructed, the electrical connections including a plurality of power rails. Constructing the electrical connections includes constructing a plurality of conductive structures configured to propagate one or more electrical signals and/or power levels.

Forming a conductive structure, e.g., a gate or drain via, signal line, metal line, power rail, or the like, includes performing a plurality of manufacturing operations including depositing and patterning one or more photoresist layers, performing one or more etching processes, and performing one or more deposition processes whereby one or more conductive materials are configured to form a continuous, low resistance structure surrounded by one or more continuous dielectric layers whereby the continuous, low resistance structure is selectively electrically connected to or isolated from various adjacent features. In some embodiments, forming a conductive structure includes performing a damascene or dual-damascene process.

In some embodiments, constructing the electrical connections includes constructing one or more of vias VD, VG, or V1 and metal segments MD, M1, or M2 discussed above with respect to FIGS. 3-4E.

In some embodiments, constructing the electrical connections including the plurality of power rails includes constructing power rails PR1-PR4 discussed above with respect to FIGS. 1B-4E. In some embodiments, constructing the plurality of power rails includes constructing a power rail of the plurality of power rails overlying first and second active areas of the first plurality of active areas and a first active area of the second plurality of active areas, e.g., constructing power rail PR2 overlying active areas AA2, AA3, and AB2 as discussed above with respect to FIG. 1B.

By performing some or all of the operations of method 500, an IC device is manufactured including a first region including a first plurality of active areas having a first pitch offset from a second plurality of active areas having a second pitch, thereby obtaining the benefits discussed above with respect to IC devices 100 and 400A-400C.

Figure 6:
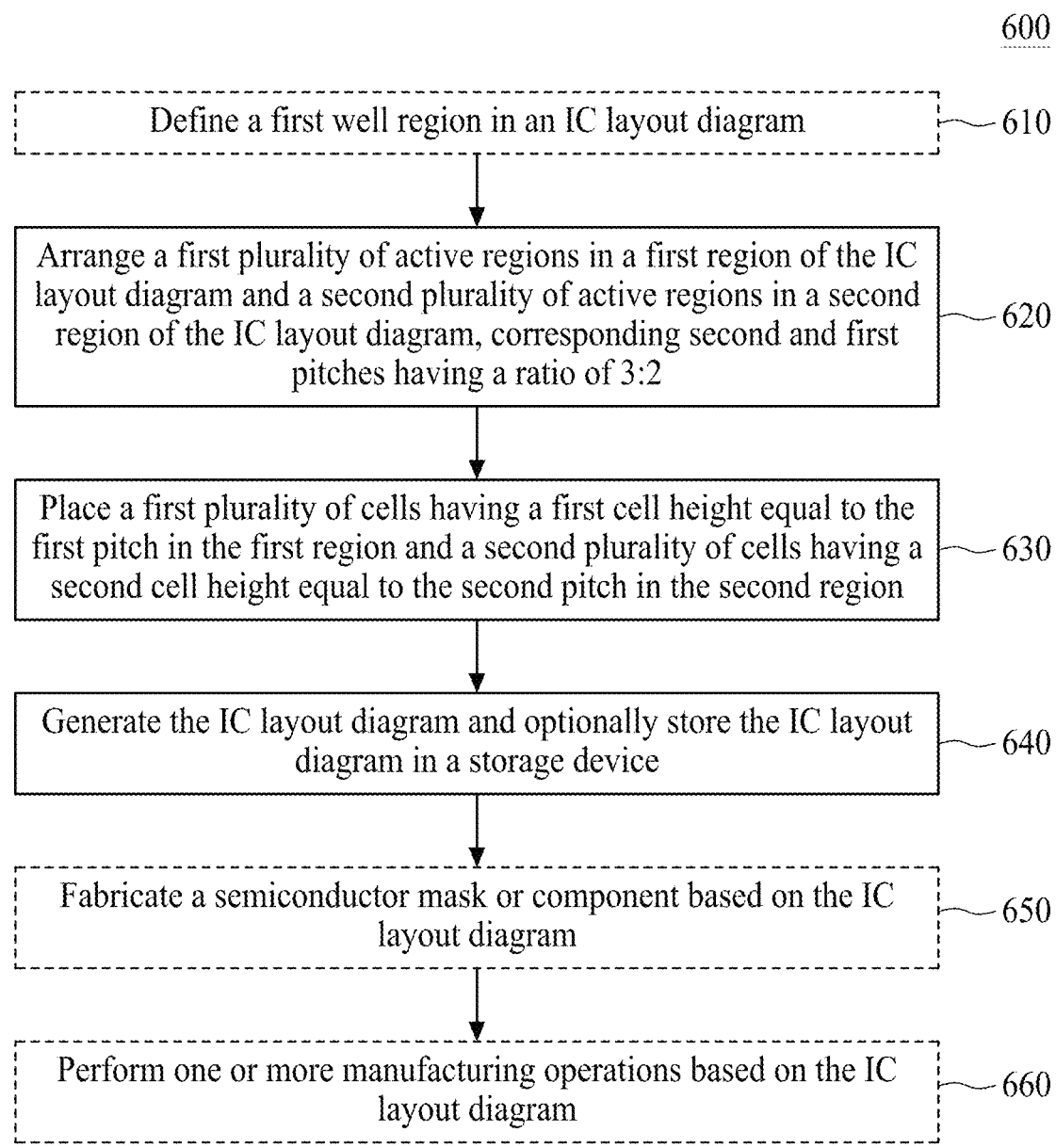
FIG. 6 is a flowchart of a method of generating an IC layout diagram, in accordance with some embodiments.

FIG. 6 is a flowchart of a method 600 of generating an IC layout diagram corresponding to an IC device, e.g., an IC layout diagram/device 100 or 400A-400C discussed above with respect to FIGS. 1A-4E, in accordance with some embodiments.

In some embodiments, some or all of method 600 is executed by a processor of a computer, e.g., a processor 702 of an IC design system 700, discussed below with respect to FIG. 7.

Some or all of the operations of method 600 are capable of being performed as part of a design procedure performed in a design house, e.g., a design house 820 discussed below with respect to FIG. 8.

In some embodiments, the operations of method 600 are performed in the order in FIG. 6. In some embodiments, the operations of method 600 are performed simultaneously and/or in an order other than the order in FIG. 6. In some embodiments, one or more operations are performed before, between, during, and/or after performing one or more operations of method 600.

At operation 610, in some embodiments, a first well is defined in an IC layout diagram. In various embodiments, defining the first well includes defining an n-well in a p-type substrate or epitaxial layer or defining a p-well in an n-type substrate or epitaxial layer. In some embodiments, defining the first well includes defining first and second wells in the substrate or epitaxial layer, the first and second wells including an n-well and a p-well.

In some embodiments, defining the first well includes defining first and second portions of the first well in respective first and second regions of the IC layout diagram, e.g., regions 100A and 100B of IC device 100 discussed above with respect to FIGS. 1A-4E.

In some embodiments, defining the first well includes defining the first well having a first width in a first region and a second width in a second region adjacent to the first region, the first width being greater than the second width. In some embodiments, defining the first well includes defining well W1 having width WWA in region 100A and having width WWB in region 100B as discussed above with respect to FIGS. 2A-2C. In some embodiments, defining the first well includes defining each of wells W1 and W2 in regions 100A and 100B as discussed above with respect to FIGS. 2A-2C.

In some embodiments, defining the first well includes defining a first portion in a first region and a second portion in a second region, the first and second portions being separated by a region defining an IC structure, e.g., a region defining an isolation structure.

At operation 620, a first plurality of active regions is arranged in the first region of the IC layout diagram and a second plurality of active regions is arranged in the second region of the IC layout diagram. A ratio of a corresponding second pitch of the second plurality of active regions to a corresponding first pitch of the first plurality of active regions is 3:2.

Arranging the first plurality of active areas includes the first plurality of active areas extending in a first direction and having the first pitch in a second direction perpendicular to the first direction, and arranging the second plurality of active areas includes the second plurality of active areas extending in the first direction, offset from the first plurality of active areas in the first direction, and having the second pitch in the second direction.

In some embodiments, arranging the first and second pluralities of active areas includes arranging the first and second pluralities of active areas in respective first and second regions of the IC layout diagram, e.g., regions 100A and 100B of IC device 100 discussed above with respect to FIGS. 1A-4E.

In some embodiments, arranging the first and second pluralities of active areas includes arranging active areas AA1-AA6 having pitch CHA and forming active areas AB1-AB4 having pitch CHB as discussed above with respect to FIGS. 1A-3.

In some embodiments, arranging the first plurality of active areas includes defining first and second active areas of the first plurality of active areas in the well, e.g., defining active areas AA2 and AA3 in well W1 as discussed above with respect to FIGS. 2A-2C, and arranging the second plurality of active areas includes defining a first active area of the second plurality of active areas in the well and continuous with the first active area of the first plurality of active areas, e.g., defining active area AB2 in well W1 as discussed above with respect to FIGS. 2A-2C.

At operation 630, a first plurality of cells having a first cell height equal to the first pitch is placed in the first region and a second plurality of cells having a second cell height equal to the second pitch is placed in the second region.

In some embodiments, placing the first plurality of cells having the first cell height in the first region and the second plurality of cells having the second cell height in the second region includes placing one or more of cell rows CA1-CA3 having cell height CHA in region 100A and one or both of cell rows CB1 and CB2 having cell height CHB in region 100B as discussed above with respect to FIGS. 1A-3.

In various embodiments, placing the first plurality of cells having the first cell height in the first region includes placing one or more cells having a total height equal to the cell height or two times the cell height, e.g., IC device 400A and/or 400B based on cell height CHA as discussed below with respect to FIGS. 4A and 4B, and/or one or more cells having greater than two times the cell height, e.g., IC device 400C discussed below with respect to FIGS. 4C-4E.

In various embodiments, placing the second plurality of cells having the second cell height in the second region includes placing one or more cells having a total height equal to the cell height or two times the cell height, e.g., IC device 400A and/or 400B based on cell height CHB as discussed below with respect to FIGS. 4A and 4B, and/or one or more cells having greater than two times the cell height, e.g., a multiple of cell height CHB.

In some embodiments, placing the first plurality of cells having the first cell height in the first region and the second plurality of cells having the second cell height in the second region includes determining that one or more cells of the second plurality of cells are included in a timing critical path of the IC device corresponding to the IC layout diagram.

Determining that a cell is part of a timing critical path of the IC device includes determining that one or more transistors of the cell has a significant effect on timing-related cell performance. The significance of an effect on timing-related cell performance is based on one or more predetermined criteria, e.g., rise time, fall time, switching speed, circuit bandwidth, or the like.

In various embodiments, determining that the cell is part of a timing critical path of the IC device is performed by receiving user input and/or by executing one or more algorithms, e.g., one or more circuit simulations, based on a layout design corresponding to some of all of the IC layout diagram of the IC device including the cell.

In various embodiments, determining that the cell is part of a timing critical path of the IC device is based on one or more manufacturing recipe parameters, one or more circuit performance specifications, and/or one or more circuit configuration criteria, e.g., parallel or series transistor arrangements.

In some embodiments, placing the first plurality of cells having the first cell height in the first region and the second plurality of cells having the second cell height in the second region includes defining a plurality of power rails overlapping each of the first and second regions, e.g., defining power rails PR1-PR4 discussed above with respect to FIGS. 1A-4E.

At operation 640, the IC layout diagram is generated, and in some embodiments, the IC layout diagram is stored in a storage device. In some embodiments, generating the IC layout diagram includes generating an electronic file having a GDSII file format, DFII file format, or other suitable format using an IC design system, e.g., IC design system 700, discussed below with respect to FIG. 7.

In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram in IC design storage 707 or over network 714 of IC design system 700, discussed below with respect to FIG. 7.

At operation 650, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 660, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 600, an IC layout diagram is generated corresponding to an IC device including a first region including a first plurality of active areas having a first pitch offset from a second plurality of active areas having a second pitch, thereby obtaining the benefits discussed above with respect to IC devices 100 and 400A-400C.

Figure 7:
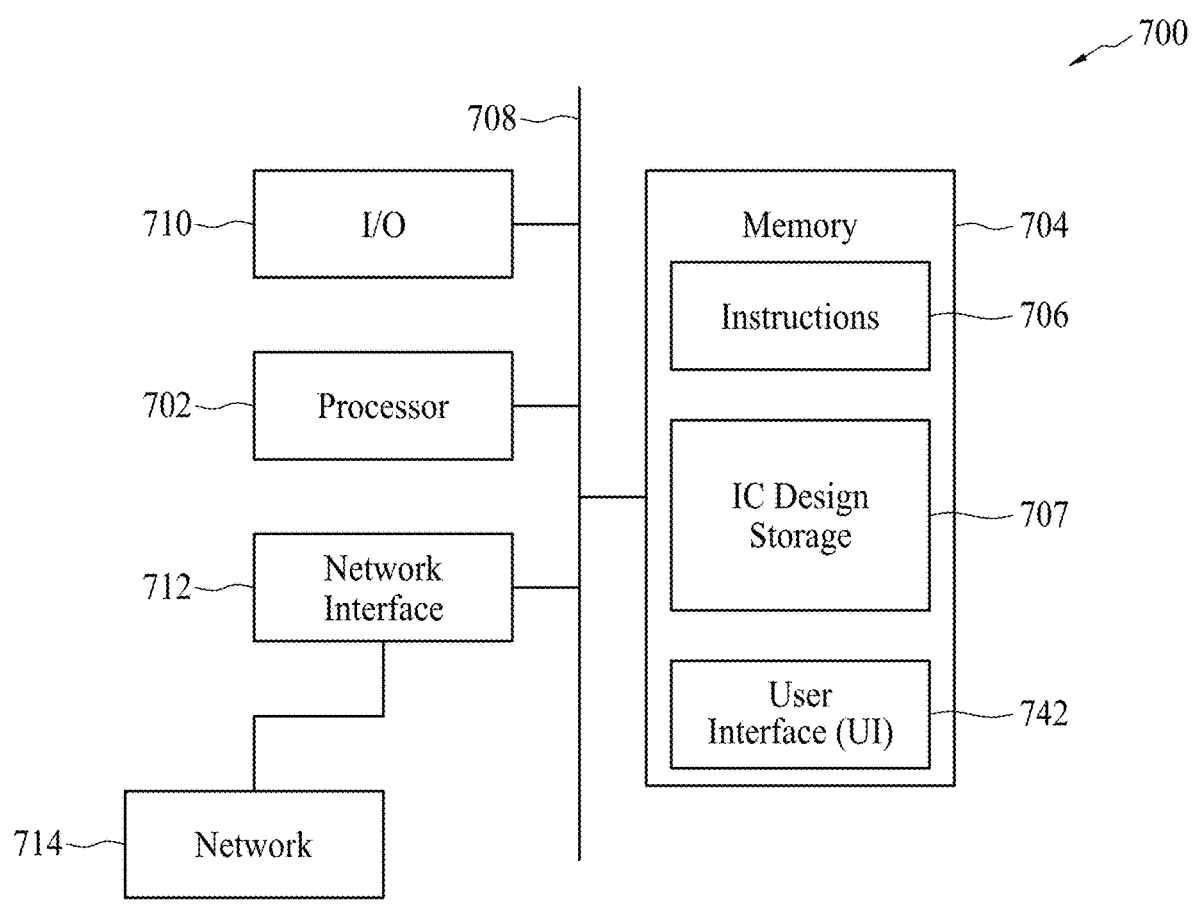
FIG. 7 is a block diagram of an IC layout diagram generation system, in accordance with some embodiments.

FIG. 7 is a block diagram of IC design system 700, in accordance with some embodiments. Methods described herein of designing IC layout diagrams in accordance with one or more embodiments are implementable, for example, using IC design system 700, in accordance with some embodiments. In some embodiments, IC design system 700 is an APR system, includes an APR system, or is part of an APR system, usable for performing an APR method.

In some embodiments, IC design system 700 is a general purpose computing device including a hardware processor 702 and non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of a method, e.g., method 600 of generating an IC layout diagram described above (hereinafter, the noted processes and/or methods).

Processor 702 is electrically coupled to computer-readable storage medium 704 via a bus 708. Processor 702 is also electrically coupled to an I/O interface 710 by bus 708. Network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause IC design system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause IC design system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 includes IC design storage 707 configured to store one or more IC layout diagrams, e.g., an IC layout diagram 100 or 400A-400C discussed above with respect to FIGS. 1A-4E.

IC design system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

IC design system 700 also includes network interface 712 coupled to processor 702. Network interface 712 allows IC design system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC design systems 700.

IC design system 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. IC design system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC design system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
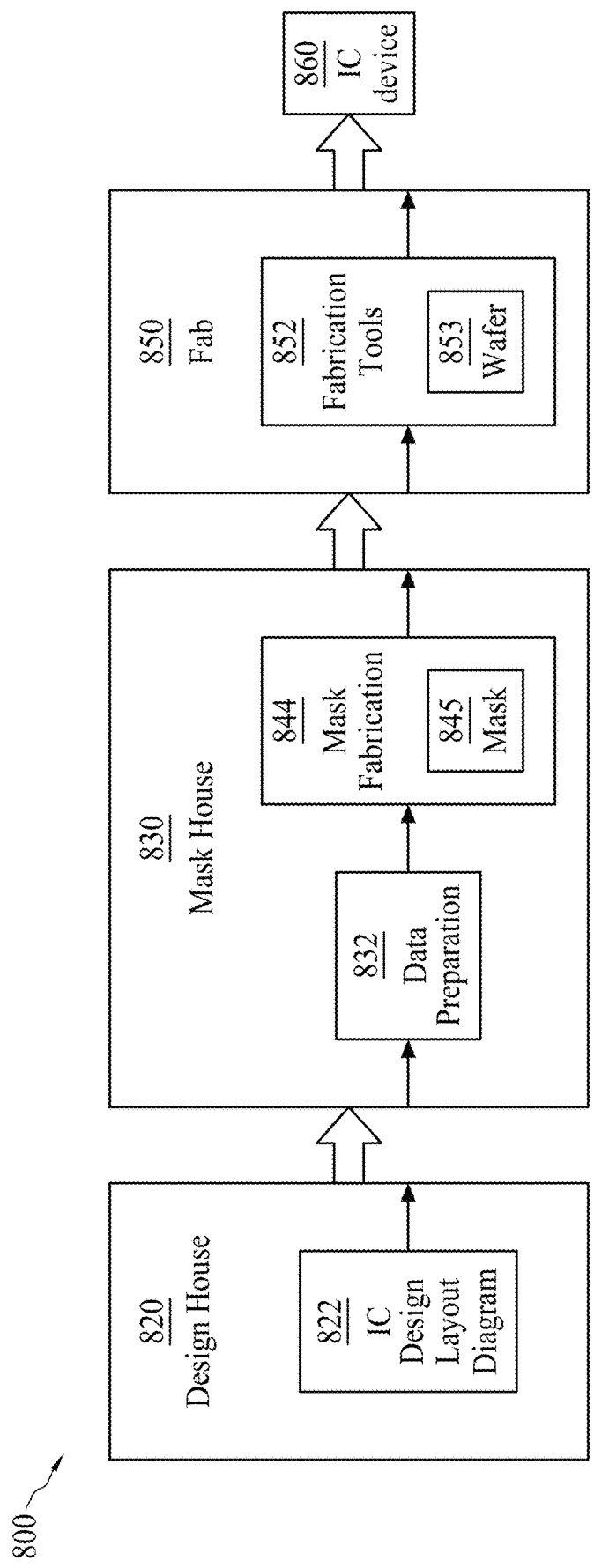
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram discussed above. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file (RDF). Mask data preparation 832 provides the RDF to mask fabrication 844. Mask fabrication 844 includes a mask writer. A mask writer converts the RDF to an image on a substrate, such as mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes wafer fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an IC manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an IC device includes a first plurality of active areas extending in a first direction and having a first pitch in a second direction perpendicular to the first direction, and a second plurality of active areas extending in the first direction, offset from the first plurality of active areas in the first direction, and having a second pitch in the second direction, and a ratio of the second pitch to the first pitch is 3:2. In some embodiments, the first plurality of active areas includes pairs of adjacent p-type active areas alternating with pairs of adjacent n-type active areas, and the second plurality of active areas includes one or more subsets, each subset including a total of four adjacent active areas arranged as individual p-type active areas alternating with individual n-type active areas. In some embodiments, the active areas of the first plurality of active areas have first widths in the second direction, and the active areas of the second plurality of active areas have second widths in the second direction greater than the first widths. In some embodiments, each active area of the first plurality of active areas has the first width being a same first width, and each active area of the second plurality of active areas has the second width being a same second width. In some embodiments, the IC device includes a plurality of power rails extending in the first direction, wherein each power rail of the plurality of power rails is positioned between adjacent p-type active areas of the first plurality of active areas or adjacent n-type active areas of the first plurality of active areas, and first through fourth adjacent power rails of the plurality of power rails are aligned with a subset of the one or more subsets of the second plurality of active areas. In some embodiments, the second power rail of the first through fourth adjacent power rails of the plurality of power rails overlies an individual p-type active area of the second plurality of active areas, and the third power rail of the first through fourth adjacent power rails of the plurality of power rails overlies an individual n-type active area of the second plurality of active areas. In some embodiments, the first plurality of active areas is located adjacent to the second plurality of active areas at a boundary extending in the second direction, a continuous well extends across the boundary, a pair of the pairs of adjacent active areas of the first plurality of active areas is located in the continuous well, and a single active area of the second plurality of active areas is located in the continuous well and is continuous with a first active area of the pair of adjacent active areas of the first plurality of active areas. In some embodiments, a first portion of the continuous well corresponding to the location of the pair of adjacent active areas of the first plurality of active areas has a first width in the second direction, a second portion of the continuous well corresponding to the location of the single active area of the second plurality of active areas has a second width in the second direction, and the first width is greater than the second width. In some embodiments, the second portion of the continuous well is aligned in the first direction with a second active area of the pair of adjacent active areas of the first plurality of active areas. In some embodiments, the continuous well is an n-type well, and each of the active areas of the pair of adjacent active areas of the first plurality of active areas and the single active area of the second plurality of active areas is a p-type active area.

In some embodiments, an IC device includes first and second power rails extending in a first direction, a first plurality of active areas extending in the first direction, and a second plurality of active areas extending in the first direction and offset from the first plurality of active areas in the first direction. The first power rail is electrically connected to a first active area of the first plurality of active areas and a first active area of the second plurality of active areas, the second power rail is electrically connected to a second active area of the first plurality of active areas and a second active area of the second plurality of active areas, the first plurality of active areas includes a third active area located between the first and second active areas and electrically connected to the second power rail, and the first and second active areas of the second plurality of active areas are adjacent active areas of the second plurality of active areas. In some embodiments, the first active area of the first plurality of active areas is continuous with the first active area of the second plurality of active areas, and the second active area of the first plurality of active areas is continuous with the second active area of the second plurality of active areas. In some embodiments, the IC device includes a well, wherein each of the second and third active areas of the first plurality of active areas and the second active area of the second plurality of active areas is located in the well. In some embodiments, the first power rail overlies each of the first active area of the first plurality of active areas and the first active area of the second plurality of active areas, and the second power rail overlies each of the second active area of the first plurality of active areas and the second active area of the second plurality of active areas. In some embodiments, each of the first and second pluralities of active areas overlies a substrate, and the second power rail overlies the substrate between the second and third active areas of the first plurality of active areas and between the first and second active areas of the second plurality of active areas. In some embodiments, each active area of the first plurality of active areas has a first width in a second direction perpendicular to the first direction, and each active area of the second plurality of active areas has a second width in the second direction greater than the first width.

In some embodiments, a method of manufacturing an IC device includes forming a first plurality of active areas extending in a first direction and having a first pitch in a second direction perpendicular to the first direction, and forming a second plurality of active areas extending in the first direction, offset from the first plurality of active areas in the first direction, and having a second pitch in the second direction. A ratio of the second pitch to the first pitch is 3:2. In some embodiments, the method includes forming a well, wherein forming the first plurality of active areas includes forming first and second active areas of the first plurality of active areas in the well, and forming the second plurality of active areas includes forming a first active area of the second plurality of active areas in the well and continuous with the first active area of the first plurality of active areas. In some embodiments, forming the well includes forming the well having a first width in the second direction corresponding to the first and second active areas of the first plurality of active areas, and a second width in the second direction corresponding to the first active area of the second plurality of active areas, and the first width is greater than the second width. In some embodiments, the method includes forming a first plurality of transistors including the first plurality of active areas and a second plurality of transistors including the second plurality of active areas, and constructing electrical connections to each of the first and second pluralities of transistors, the electrical connections including a plurality of power rails, wherein a power rail of the plurality of power rails overlies first and second active areas of the first plurality of active areas and a first active area of the second plurality of active areas.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) device comprising:
    a first plurality of active areas extending in a first direction and having a first pitch in a second direction perpendicular to the first direction; and
    a second plurality of active areas extending in the first direction, offset from the first plurality of active areas in the first direction, and having a second pitch in the second direction,
    wherein
        the first plurality of active areas comprises one or more pairs of adjacent p-type active areas alternating with one or more pairs of adjacent n-type active areas, each p-type active area and each n-type active area of the first plurality of active areas thereby being adjacent to both a p-type active area and an n-type active area, and
        a ratio of the second pitch to the first pitch is 3:2.

2. The IC device of claim 1, wherein
    the second plurality of active areas comprises one or more subsets, each subset comprising a total of four adjacent active areas arranged as individual p-type active areas alternating with individual n-type active areas.

3. The IC device of claim 2, wherein
    the active areas of the first plurality of active areas have first widths in the second direction, and
    the active areas of the second plurality of active areas have second widths in the second direction greater than the first widths.

4. The IC device of claim 3, wherein
    each active area of the first plurality of active areas has the first width being a same first width, and
    each active area of the second plurality of active areas has the second width being a same second width.

5. The IC device of claim 2, further comprising a plurality of power rails extending in the first direction, wherein
    each power rail of the plurality of power rails is positioned between adjacent p-type active areas of the first plurality of active areas or adjacent n-type active areas of the first plurality of active areas, and
    first through fourth adjacent power rails of the plurality of power rails are aligned with a subset of the one or more subsets of the second plurality of active areas.

6. The IC device of claim 5, wherein
    the second power rail of the first through fourth adjacent power rails of the plurality of power rails overlies an individual p-type active area of the second plurality of active areas, and
    the third power rail of the first through fourth adjacent power rails of the plurality of power rails overlies an individual n-type active area of the second plurality of active areas.

7. The IC device of claim 2, wherein
    the first plurality of active areas is located adjacent to the second plurality of active areas at a boundary extending in the second direction,
    a continuous well extends across the boundary, a pair of the pairs of adjacent active areas of the first plurality of active areas is located in the continuous well, and a single active area of the second plurality of active areas is located in the continuous well and is continuous with a first active area of the pair of adjacent active areas of the first plurality of active areas.

8. The IC device of claim 7, wherein a first portion of the continuous well corresponding to the location of the pair of adjacent active areas of the first plurality of active areas has a first width in the second direction, a second portion of the continuous well corresponding to the location of the single active area of the second plurality of active areas has a second width in the second direction, and the first width is greater than the second width.

9. The IC device of claim 8, wherein the second portion of the continuous well is aligned in the first direction with a second active area of the pair of adjacent active areas of the first plurality of active areas.

10. The IC device of claim 7, wherein the continuous well is an n-type well, and each of the active areas of the pair of adjacent active areas of the first plurality of active areas and the single active area of the second plurality of active areas is a p-type active area.

11. A method of manufacturing an integrated circuit (IC) device, the method comprising:

forming a first plurality of active areas extending in a first direction and having a first pitch in a second direction perpendicular to the first direction; and forming a second plurality of active areas extending in the first direction, offset from the first plurality of active areas in the first direction, and having a second pitch in the second direction, wherein the forming the first plurality of active areas comprises forming one or more pairs of adjacent p-type active areas alternating with one or more pairs of adjacent n-type active areas, each p-type active area and each n-type active area of the first plurality of active areas thereby being adjacent to both a p-type active area and an n-type active area, and a ratio of the second pitch to the first pitch is 3:2.

12. The method of claim 11, further comprising forming a well, wherein the forming the first plurality of active areas comprises forming a first pair of the one or more pairs of adjacent p-type or one or more adjacent n-type active areas of the first plurality of active areas in the well; and the forming the second plurality of active areas comprises forming a first active area of the second plurality of active areas in the well and continuous with a first active area of the first pair.

13. The method of claim 12, wherein the forming the well comprises forming the well having a first width in the second direction corresponding to the first and second active areas of the first plurality of active areas, and a second width in the second direction corresponding to the first active area of the second plurality of active areas, and the first width is greater than the second width.

14. The method of claim 11, further comprising:

forming a first plurality of transistors comprising the first plurality of active areas and a second plurality of transistors comprising the second plurality of active areas; and constructing electrical connections to each of the first and second pluralities of transistors, the electrical connections comprising a plurality of power rails, wherein a power rail of the plurality of power rails overlies both active areas of a pair of the one or more pairs of adjacent p-type or one or more adjacent n-type active areas of the first plurality of active areas and a first active area of the second plurality of active areas.

15. An integrated circuit (IC) device comprising:

a first plurality of active areas extending in a first direction and having a first pitch in a second direction perpendicular to the first direction;

a second plurality of active areas extending in the first direction, offset from the first plurality of active areas in the first direction, and having a second pitch in the second direction; and a plurality of power rails extending in the first direction over the first and second pluralities of active areas, wherein a ratio of the second pitch to the first pitch is 3:2, the first plurality of active areas comprises one or more pairs of adjacent p-type active areas alternating with one or more pairs of adjacent n-type active areas, each p-type active area and each n-type active area of the first plurality of active areas thereby being adjacent to both a p-type active area and an n-type active area, and each power rail of the plurality of power rails is positioned between a corresponding pair of adjacent p-type active areas or adjacent n-type active areas of the first plurality of active areas.

16. The IC device of claim 15, wherein at least one of the pairs of adjacent p-type active areas or adjacent n-type active areas of the first plurality of active areas comprises:

a first one of the adjacent p-type or n-type active areas continuous with a corresponding p-type or n-type active area of the second plurality of active areas.

17. The IC device of claim 16, wherein the first one of the adjacent p-type or n-type active areas of the first plurality of active areas and the corresponding p-type or n-type active area of the second plurality of active areas are positioned in a continuous well of a corresponding n-type or p-type.

18. The IC device of claim 16, wherein the at least one of the pairs of adjacent p-type active areas or adjacent n-type active areas of the first plurality of active areas further comprises:

a second one of the adjacent p-type or n-type active areas comprising an endpoint at the second plurality of active areas.

19. The IC device of claim 15, wherein each active area of the adjacent p-type active areas of the first plurality of active areas or adjacent n-type active areas of the first plurality of active areas comprises:

a source drain region electrically connected to the corresponding power rail of the plurality of power rails.

20. The IC device of claim 15, further comprising:

a third plurality of active areas extending in the first direction and having the first pitch in the second direction, wherein the second plurality of active areas is positioned between the first and third pluralities of active areas, and the plurality of power rails extends in the first direction over the third plurality of active areas.

\* \* \* \* \*